US009488521B2

(12) United States Patent
Maeda et al.

(10) Patent No.: US 9,488,521 B2
(45) Date of Patent: Nov. 8, 2016

(54) METHOD FOR OPERATING OPTICAL SENSOR CIRCUIT, AND METHOD FOR OPERATING DISPLAY APPARATUS PROVIDED WITH OPTICAL SENSOR CIRCUIT

(71) Applicant: Sharp Kabushiki Kaisha, Osaka-shi, Osaka (JP)

(72) Inventors: Kazuhiro Maeda, Osaka (JP); Hiroaki Sugiyama, Osaka (JP); Yousuke Nakagawa, Osaka (JP); Yasuhiro Sugita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 330 days.

(21) Appl. No.: 14/362,433

(22) PCT Filed: Dec. 5, 2012

(86) PCT No.: PCT/JP2012/081526
§ 371 (c)(1),
(2) Date: Jun. 3, 2014

(87) PCT Pub. No.: WO2013/084947
PCT Pub. Date: Jun. 13, 2013

(65) Prior Publication Data
US 2014/0339400 A1 Nov. 20, 2014

(30) Foreign Application Priority Data

Dec. 7, 2011 (JP) .................. 2011-268385

(51) Int. Cl.
*G01J 1/44* (2006.01)
*G06F 3/041* (2006.01)
(Continued)

(52) U.S. Cl.
CPC ............. *G01J 1/44* (2013.01); *G06F 3/042* (2013.01); *G06F 3/0412* (2013.01);
(Continued)

(58) Field of Classification Search
CPC .... G06F 3/0412; G06F 3/0418; G06F 3/042; G09G 3/3406; G09G 2360/145; G09G 2310/0237; H01L 31/105; H01L 27/14623; H01L 27/14641; H01L 27/14678; H01L 27/14632; H01L 27/14643; G01J 1/44; G01J 2001/444; G01J 2001/446; G02F 2001/13312
See application file for complete search history.

(56) References Cited

U.S. PATENT DOCUMENTS 5,838,290 A * 11/1998 Kuijk .................. G09G 3/367
345/207
5,898,416 A * 4/1999 Kuijk .................. G09G 3/367
345/90

(Continued)

FOREIGN PATENT DOCUMENTS

| JP | 2008-185868 A | 8/2008 |
| JP | 2011-076023 A | 4/2011 |
| JP | 2011-141370 A | 7/2011 |

OTHER PUBLICATIONS

Official Communication issued in International Patent Application No. PCT/JP2012/081526, mailed on Jan. 29, 2013.

*Primary Examiner* — John Lee
(74) *Attorney, Agent, or Firm* — Keating & Bennett, LLP

(57) ABSTRACT

In a method of operating an optical sensor circuit (11) in accordance with one embodiment of the present invention, main reset is performed prior to sensing of incident light with use of a PIN diode (4) and, between the main reset and next main reset, auxiliary reset is performed so that a potential of a cathode terminal of the PIN diode (4) is reduced within a predetermined range within which storage of carriers is not induced in an intrinsic region of the PIN diode (4).

6 Claims, 29 Drawing Sheets

(51) Int. Cl.
  *G06F 3/042* (2006.01)
  *G09G 3/34* (2006.01)
  *H01L 31/105* (2006.01)
  *G02F 1/133* (2006.01)

(52) U.S. Cl.
  CPC ...... G06F 3/0418 (2013.01); *G01J 2001/444* (2013.01); *G01J 2001/446* (2013.01); *G02F 2001/13312* (2013.01); *G09G 3/3406* (2013.01); *G09G 2310/0237* (2013.01); *G09G 2360/145* (2013.01); *H01L 31/105* (2013.01)

(56) References Cited

U.S. PATENT DOCUMENTS

| | | | | |
|---|---|---|---|---|
| 8,493,372 B2* | 7/2013 | Yagi | | G06F 1/1616 |
| | | | | 33/366.16 |
| 9,357,143 B2* | 5/2016 | Yamada | | H04N 5/351 |
| 2009/0268132 A1* | 10/2009 | Takama | | G02F 1/13338 |
| | | | | 349/106 |
| 2010/0194722 A1* | 8/2010 | Yagi | | G06F 1/1616 |
| | | | | 345/206 |
| 2011/0043471 A1* | 2/2011 | Senda | | G06F 3/0412 |
| | | | | 345/173 |
| 2011/0079704 A1* | 4/2011 | Yu | | H01L 27/14607 |
| | | | | 250/208.1 |
| 2011/0109592 A1* | 5/2011 | Kurokawa | | G06F 3/0412 |
| | | | | 345/175 |
| 2011/0147596 A1* | 6/2011 | Ishida | | H01L 27/14659 |
| | | | | 250/366 |
| 2011/0267562 A1* | 11/2011 | Yashiro | | G02F 1/13338 |
| | | | | 349/62 |
| 2011/0315860 A1* | 12/2011 | Brown | | G06F 3/0412 |
| | | | | 250/214 R |
| 2012/0001880 A1* | 1/2012 | Brown | | G06F 3/0412 |
| | | | | 345/207 |
| 2012/0091321 A1* | 4/2012 | Tanaka | | G06F 3/0412 |
| | | | | 250/208.2 |
| 2012/0242621 A1* | 9/2012 | Brown | | H01L 27/14623 |
| | | | | 345/175 |
| 2013/0100302 A1* | 4/2013 | Senda | | A61B 6/4233 |
| | | | | 348/207.99 |
| 2013/0100327 A1* | 4/2013 | Senda | | H04N 5/32 |
| | | | | 348/301 |
| 2013/0100330 A1* | 4/2013 | Yamada | | H04N 5/32 |
| | | | | 348/333.01 |
| 2013/0107088 A1* | 5/2013 | Minami | | H04N 5/378 |
| | | | | 348/294 |
| 2013/0107092 A1* | 5/2013 | Minami | | H04N 5/32 |
| | | | | 348/301 |
| 2014/0339400 A1* | 11/2014 | Maeda | | G06F 3/0412 |
| | | | | 250/214 C |

* cited by examiner

F I G. 1
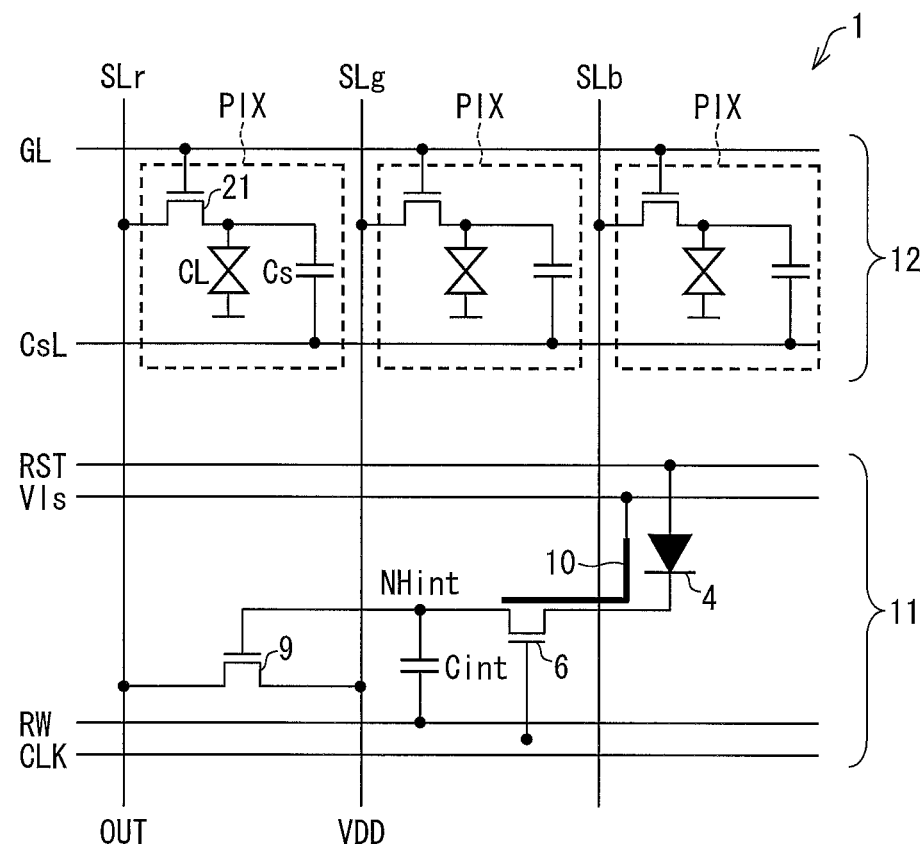

F I G. 2
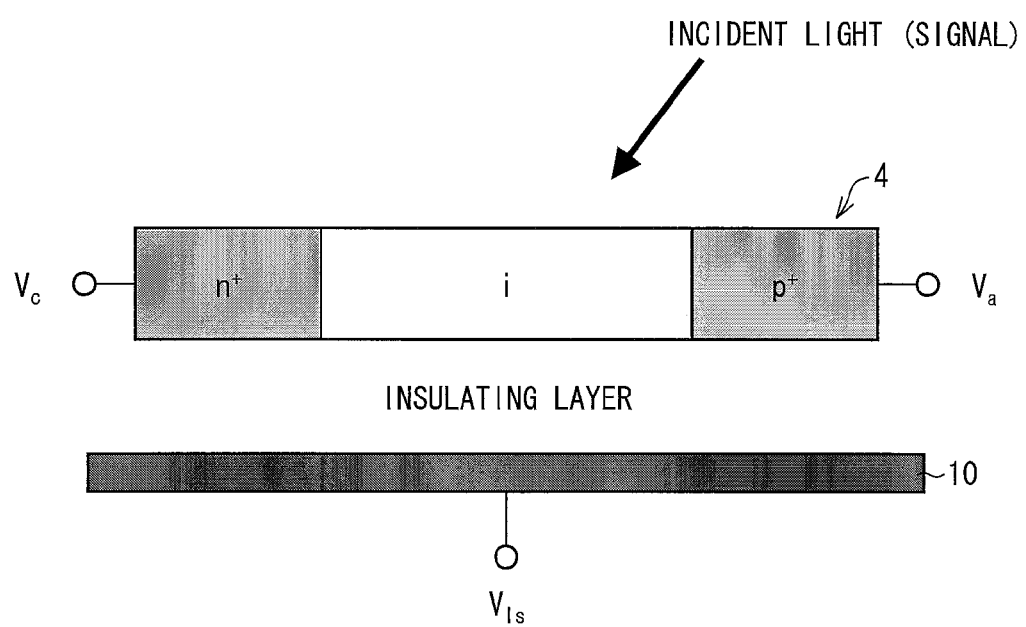

F I G. 3
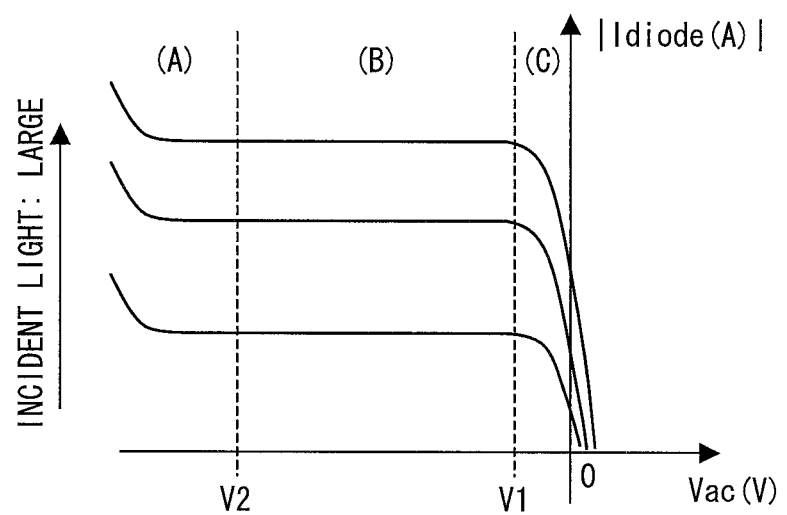

MODE A $(V_a + V_{th\_p}) < V_{ls} < (V_c + V_{th\_n})$

MODE B $$V_{ls} \leqq (V_a + V_{th\_p}) < (V_c + V_{th\_n})$$

MODE C $$(V_a + V_{th\_p}) < (V_c + V_{th\_n}) \leqq V_{ls}$$

F I G. 8
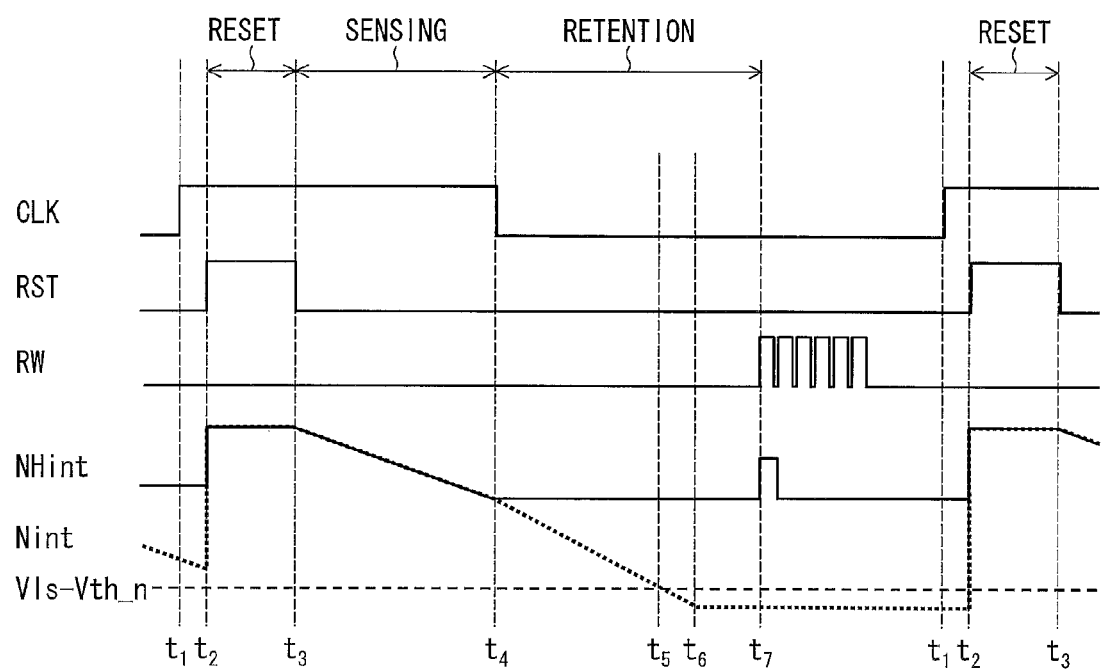

F I G. 9
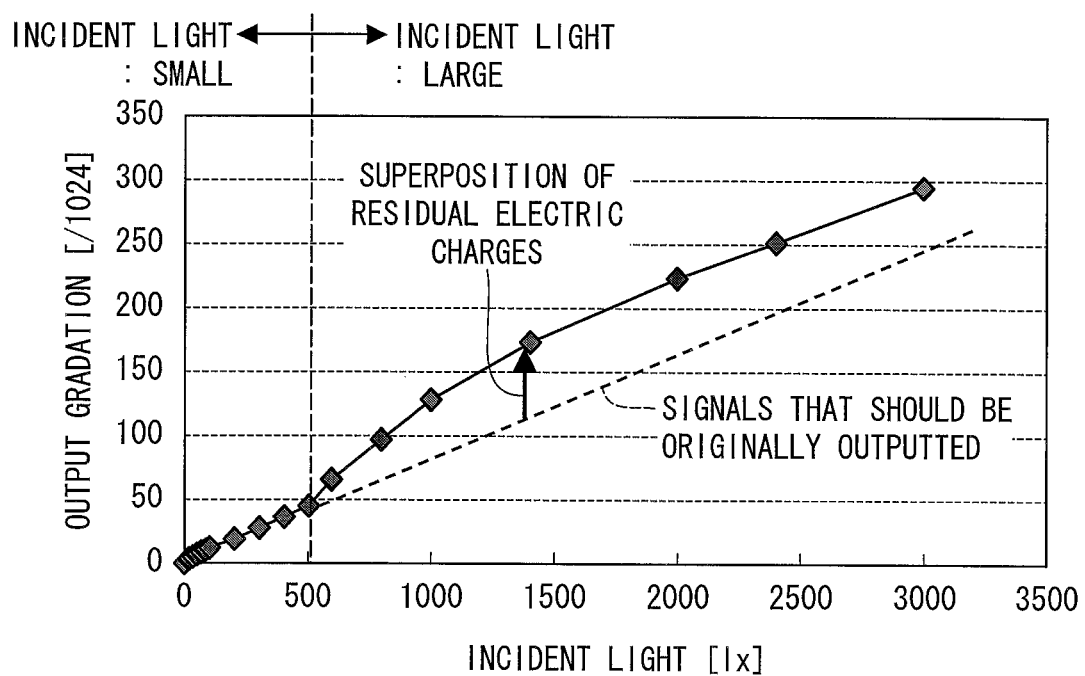

F I G. 1 1
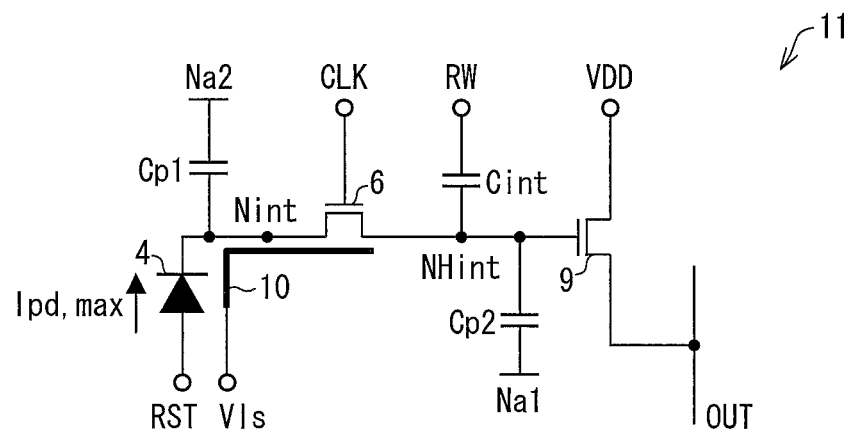

F I G. 1 2
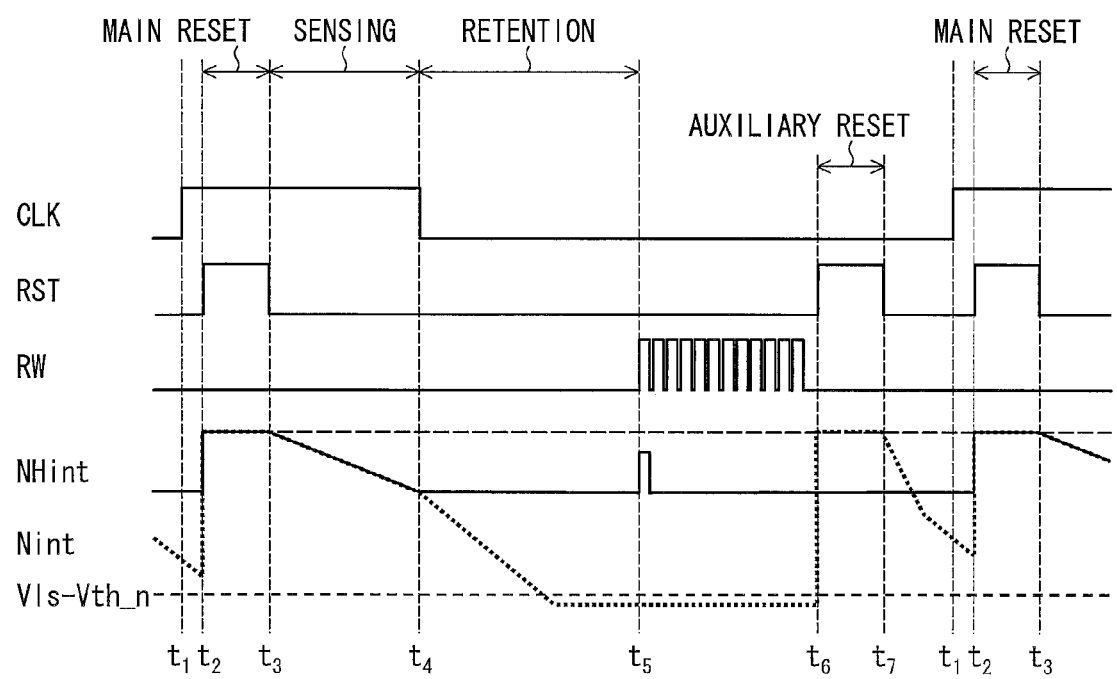

F I G. 1 6
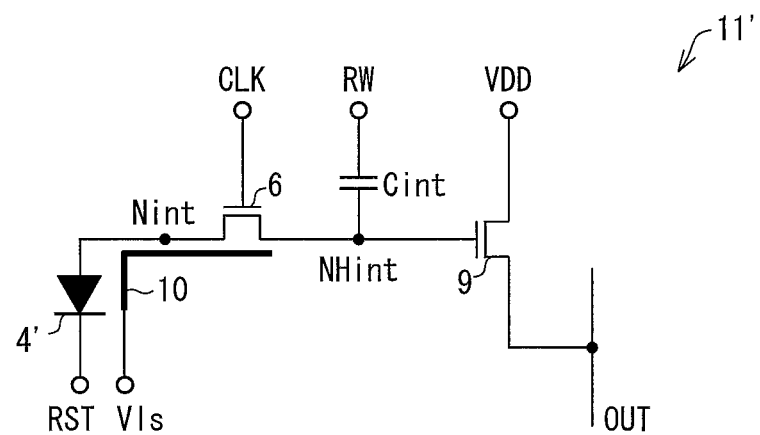

F I G. 1 9
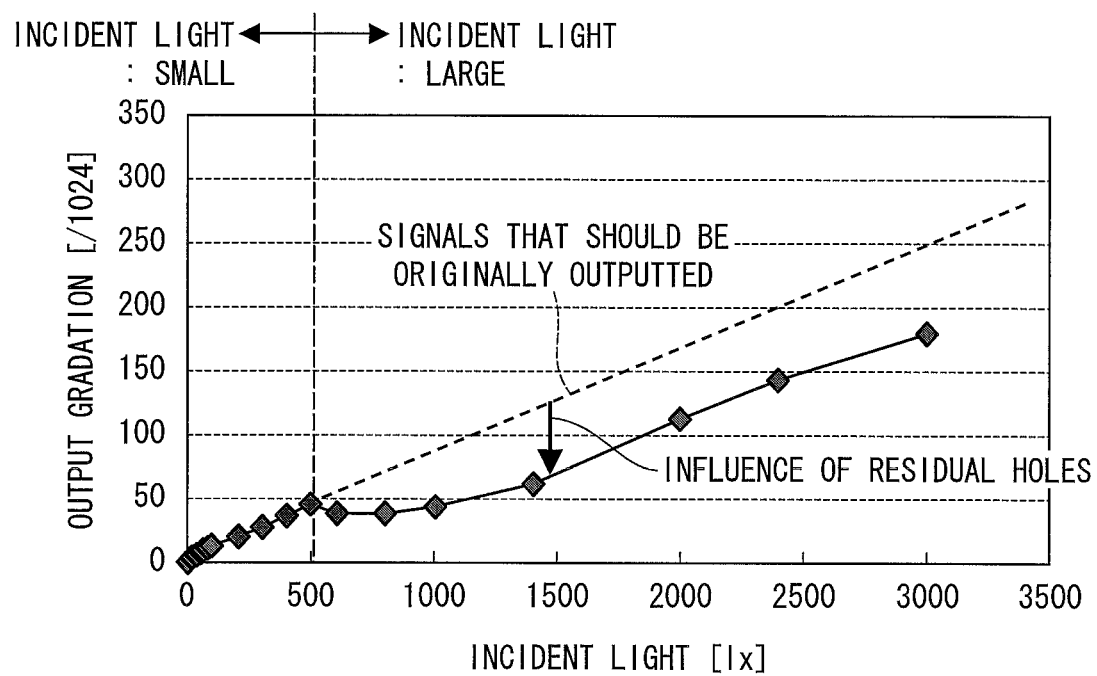

F I G. 2 0
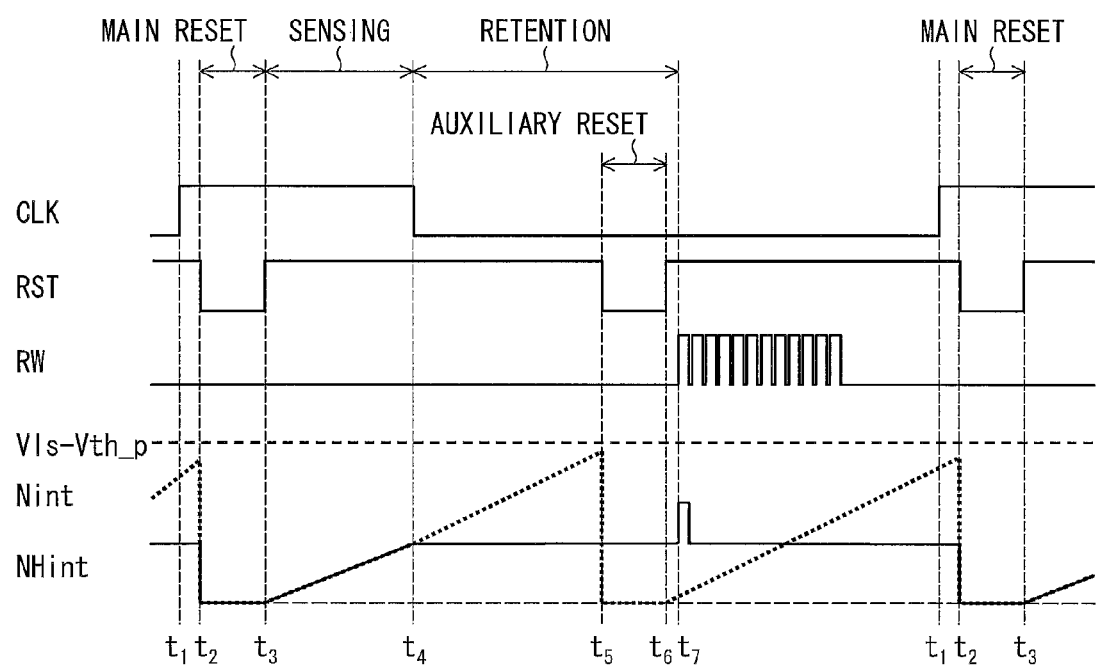

F I G. 2 1
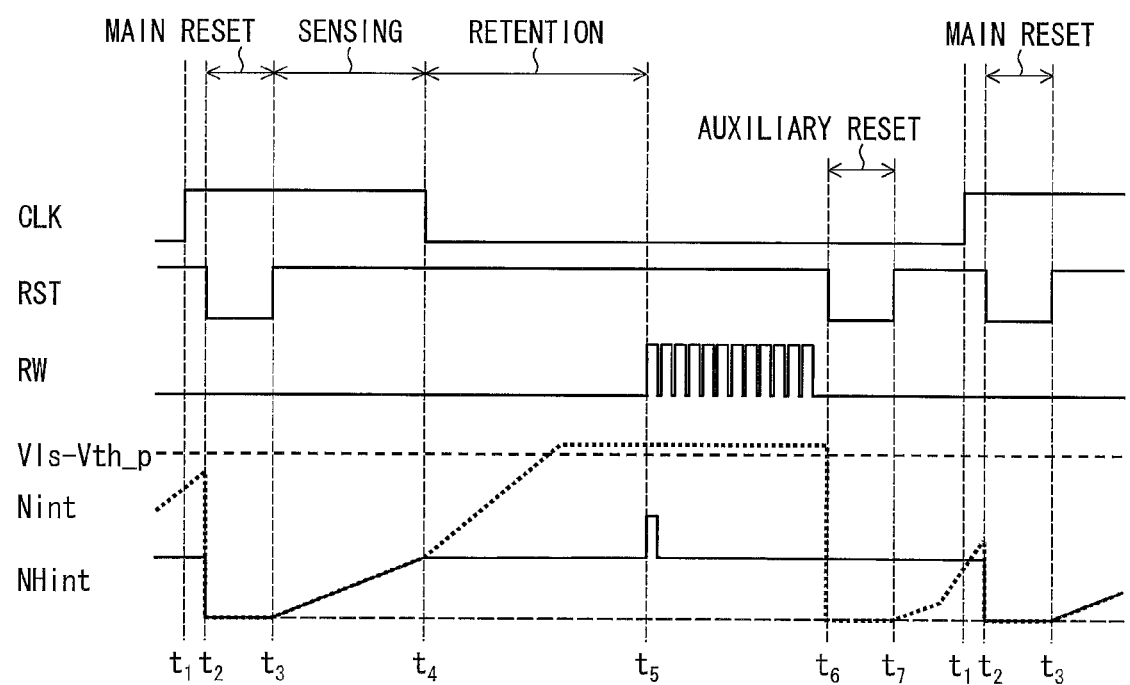

F I G. 2 5
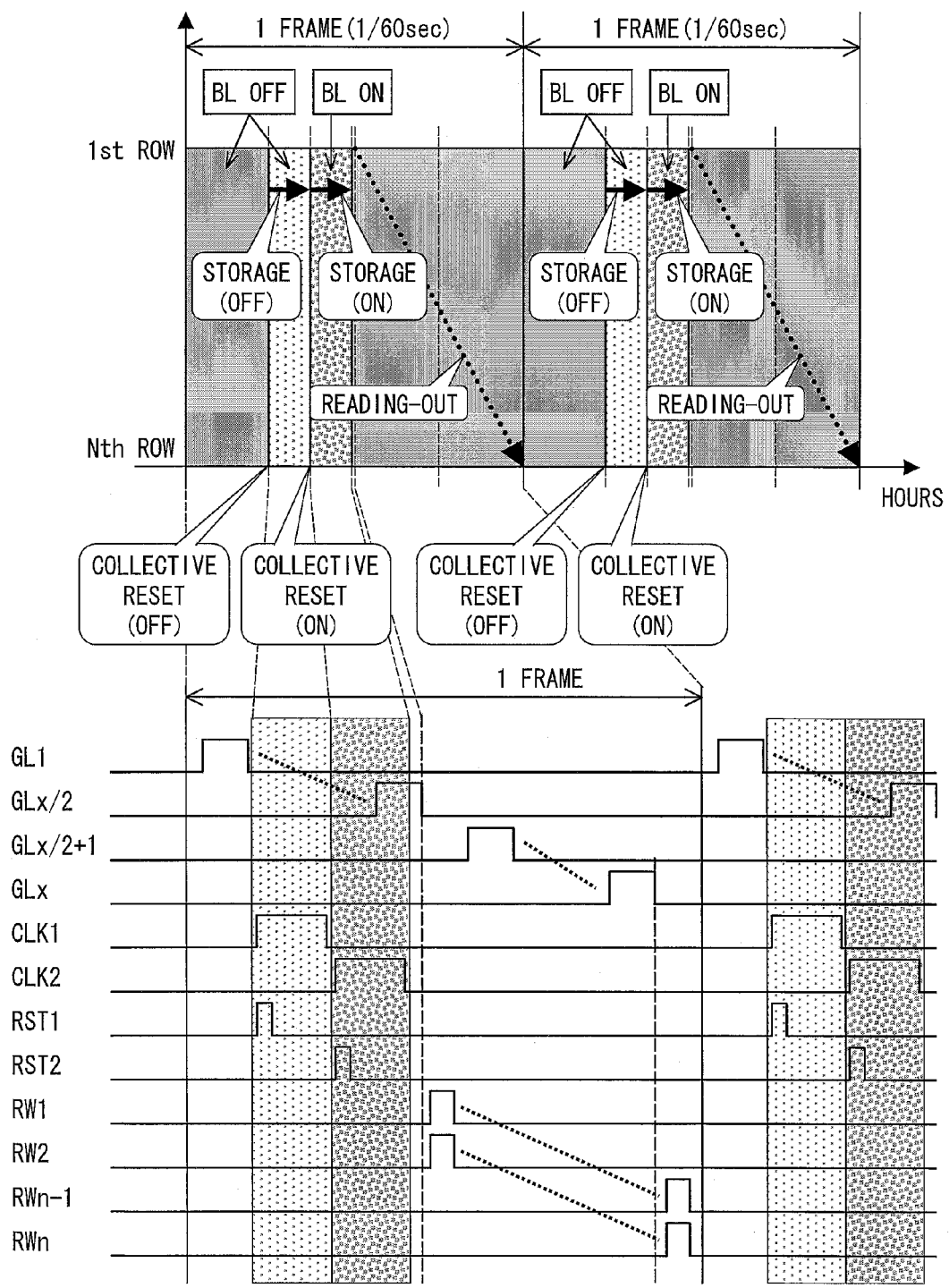

METHOD FOR OPERATING OPTICAL SENSOR CIRCUIT, AND METHOD FOR OPERATING DISPLAY APPARATUS PROVIDED WITH OPTICAL SENSOR CIRCUIT

TECHNICAL FIELD

The present invention relates to a method of operating an optical sensor circuit with use of photodiodes, and relates to, for example, a method of operating an optical sensor circuit which is mounted on a display device.

BACKGROUND ART

There are known display devices, such as liquid crystal display devices and organic EL display devices, which achieved a touch screen function and a function of maintaining or improving display quality by providing optical sensor circuits on display sections of the display devices.

FIG. 27 is a view illustrating a configuration of a display device disclosed in Patent Literature 1. A display device 150 of FIG. 27 includes an image signal output circuit 152, a display section 153, a writing scanning circuit 154, a sensor scanning circuit 155, and a sensor output detection circuit 156. On the display section 153, $121_{N,M}$ are arranged in matrix from a pixel circuit $121_{1,1}$, and $161_{N,M}$ are arranged in matrix from a light receiving circuit $161_{1,1}$ serving as an optical sensor circuit so that the pixel circuits 121 correspond to the respective light receiving circuits 161. As illustrated in FIG. 28, each of the light receiving circuits 161 includes a sensor transistor $T_{SE}$, a retention capacitor Cse, an output transistor $T_{OUT}$ with use of a n-channel TFT, and a reading-out transistor $T_{RS}$. The light receiving circuit 161 functions as an optical sensor while the sensor transistor $T_{SE}$ is in an off state. In other words, in a case where the sensor transistor $T_{SE}$ is off, a leak current corresponding to an amount of received light is flown through a gate of the output transistor $T_{out}$. In a case where the sensor transistor $T_{SE}$ is off, the sensor transistor $T_{SE}$ has such a characteristic that a leak current is increased or decreased in accordance with the amount of the received light. That is, as the amount of the received light is larger, the leak current is increased, whereas, as the amount of the received light is smaller, the leak current is decreased. Thus, an optical detection signal depending on the amount of the received light is outputted via a sensor output line SOL with use of the light receiving circuit 161.

It is also known a configuration that achieves an optical sensor circuit with use of a PIN (P-intrinsic-N) diode, instead of an optical sensor circuit including the above transistor. FIG. 29 illustrates a configuration of a liquid crystal display device having the above configuration. The liquid crystal display device illustrated in FIG. 29 includes a PIN diode 204, a thin film transistor (TFT) 206 for retaining data, a storage capacitor (Cint) 208, and a light-blocking film 210.

The TFT 206 retains, as data, an electric signal outputted from the PIN diode 204, and is close to the PIN diode 204 so as to be connected to the PIN diode 204. The light-blocking film 210 is formed to be close to the PIN diode 204 and the TFT 206 so as to block light incident upon the PIN diode 204 and the TFT 206 from backlight. Further, it is possible to pick out, as a sensor output, a change in potential caused by charging a storage capacitor 208. The light-blocking film 210 can block light incident upon the PIN diode 204 directly from the backlight, and can prevent an off-leak current caused by allowing light to be incident upon the TFT 206 to generate carriers. Further, since the PIN diode 204 is close to the light-blocking film 210, a voltage to be applied to the light-blocking film 210 is also applied to the PIN diode 204. Note that the data is read out in a direction indicated by an arrow A. A configuration including such a PIN diode as an optical sensor circuit is disclosed in, for example, Patent Literatures 2 and 3.

CITATION LIST

Patent Literature 1
Japanese Patent Application Publication, Tokukai, No. 2011-141370 A (Publication date: Jul. 21, 2011)
Patent Literature 2
Japanese Patent Application Publication, Tokukai, No. 2011-76023 A (Publication date: Apr. 14, 2011)
Patent Literature 3
Japanese Patent Application Publication, Tokukai, No. 2008-185868 A (Publication date: Aug. 14, 2008)

SUMMARY OF INVENTION

Technical Problem

In a device configuring an optical sensor circuit including a photodiode, in a case where the optical sensor circuit is driven (operated) under an environment of a predetermined or more amount of incident light, a potential of a terminal whose potential is changed in proportion to the amount of incident light, which terminal is one of an anode terminal and a cathode terminal of the photodiode, is shifted so large that carriers are induced in an intrinsic region of the photodiode with respect to a potential of a light-blocking layer. The carriers stored in the intrinsic region do not disappear completely from the intrinsic region even during a resetting process that is performed immediately before sensing, and accidentally cause a change in photocurrent that is original data while the sensing is being performed after the resetting process. Therefore, an actual sensor output indicated by a broken line in FIG. 9 (described below), which sensor output should be originally outputted, is apart from an ideal relationship (in FIG. 9, straight-line shape) between the sensor output and the amount of incident light, which results in becoming a state indicated by a broken line. This causes an output error.

Solution to Problem

The present invention has been made in view of the above problems, and an object of the present invention is to provide a method of operating an optical sensor circuit including a photodiode, which optical sensor circuit is capable of performing accurate sensing without storing carriers in the intrinsic region of the photodiode and a method of operating a display device including the optical sensor circuit.

In view of the circumstances, in order to achieve the above object, a method of operating an optical sensor circuit according to the present invention, the optical sensor circuit comprising a PIN diode, a thin film transistor which is close to the PIN diode so as to be connected to the PIN diode and retains, as data, electric signals outputted from the PIN diode, and a light-blocking layer which is formed to be close at least to the PIN diode so as to block light incident in a certain direction on the PIN diode, the method includes the steps of: performing sensing of incident light with use of the PIN diode at regular intervals and performing main reset prior to each sensing; and performing auxiliary reset during a period between certain main reset and next main reset so that a potential of one of an anode terminal and a cathode terminal of the PIN diode immediately before the next main reset, the potential of which is changed in proportion to an amount of incident light, is reduced within a predetermined range within which storage of carriers is not induced in an intrinsic region of the PIN diode.

Advantageous Effects of Invention

A method of operating an optical sensor circuit according to the present invention, the optical sensor circuit comprising a PIN diode, a thin film transistor which is close to the PIN diode so as to be connected to the PIN diode and retains, as data, electric signals outputted from the PIN diode, and a light-blocking layer which is formed to be close at least to the PIN diode so as to block light incident in a certain direction on the PIN diode, the method includes the steps of: performing sensing of incident light with use of the PIN diode at regular intervals and performing main reset prior to each sensing; and performing auxiliary reset during a period between certain main reset and next main reset so that a potential of one of an anode terminal and a cathode terminal of the PIN diode is changed in proportion to an amount of incident light is reduced within a predetermined range within which storage of carriers is not induced in an intrinsic region of the PIN diode.

With the above configuration, electric charges are not inconveniently stored in an intrinsic region, i.e., residual electric charges are not generated in main reset that is performed immediately before the sensing. Therefore, it is possible to maintain a relationship between a sensor output and an amount of incident light in a straight-line shape without changing, at the time of sensing, a photocurrent which is original data.

BRIEF DESCRIPTION OF DRAWINGS

FIG. 1 is a schematic view illustrating a display section of a liquid crystal display device on which an embodiment of an optical sensor circuit of the present invention is mounted.

FIG. 2 is a schematic view illustrating a PIN diode mounted on the optical sensor circuit of the display section illustrated in FIG. 1.

FIG. 3 is a graph showing an IV characteristic of the PIN diode illustrated in FIG. 2.

Figure 7:
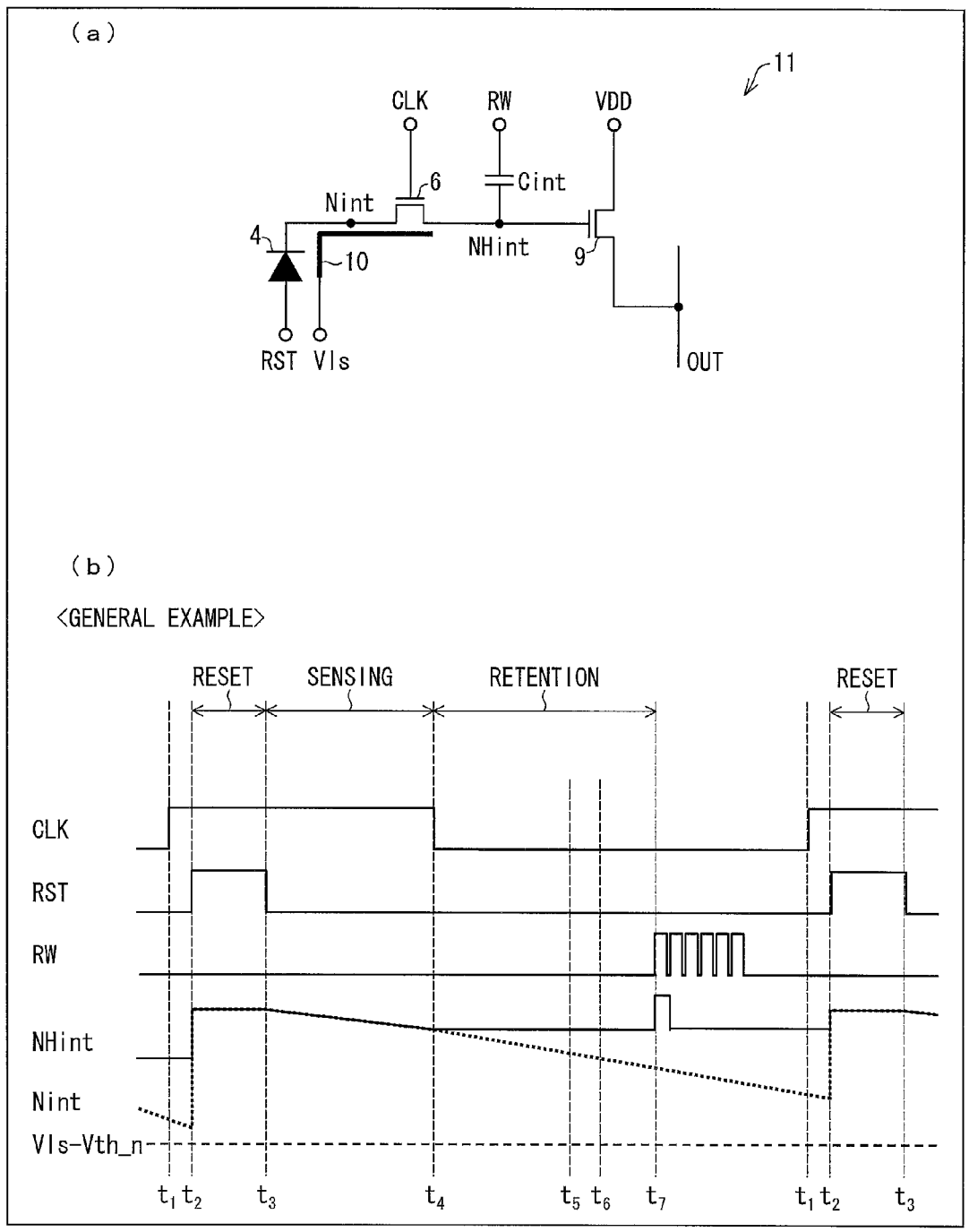

(a) of FIG. 7 is a circuit diagram illustrating a configuration of the optical sensor circuit illustrated in FIG. 1, and (b) of FIG. 7 is a timing chart shown in a case where the amount of incident light is small in a general method of operating the optical sensor circuit.

FIG. 8 is a timing chart shown in a case where the amount of incident light is large in a general method of operating the optical sensor circuit illustrated in FIG. 1.

FIG. 9 is view showing a problem that is arose in a case where an optical sensor circuit is driven by the general method shown in FIG. 8.

Figure 10:
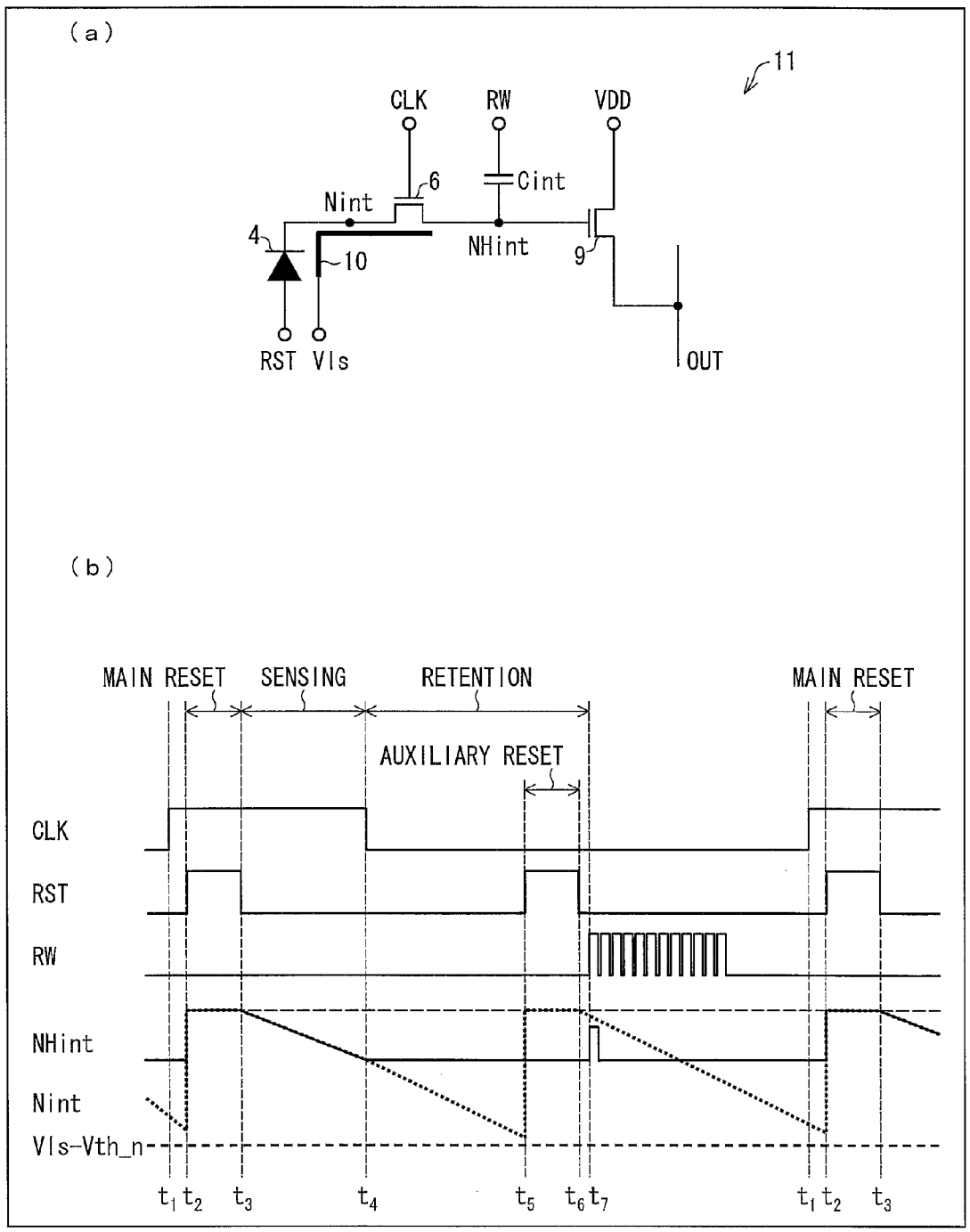

(a) of FIG. 10 is a circuit diagram illustrating a configuration of the optical sensor circuit illustrated in FIG. 1, and (b) of FIG. 10 is a timing chart shown in a case where the optical sensor circuit is operated by one embodiment of an operating method according to the present invention.

FIG. 11 is a circuit diagram illustrating a configuration of the optical sensor circuit illustrated in FIG. 1.

FIG. 12 is a timing chart shown in a case where the optical sensor circuit is operated by a first modification example of the operating method shown in (b) of FIG. 10.

Figure 13:
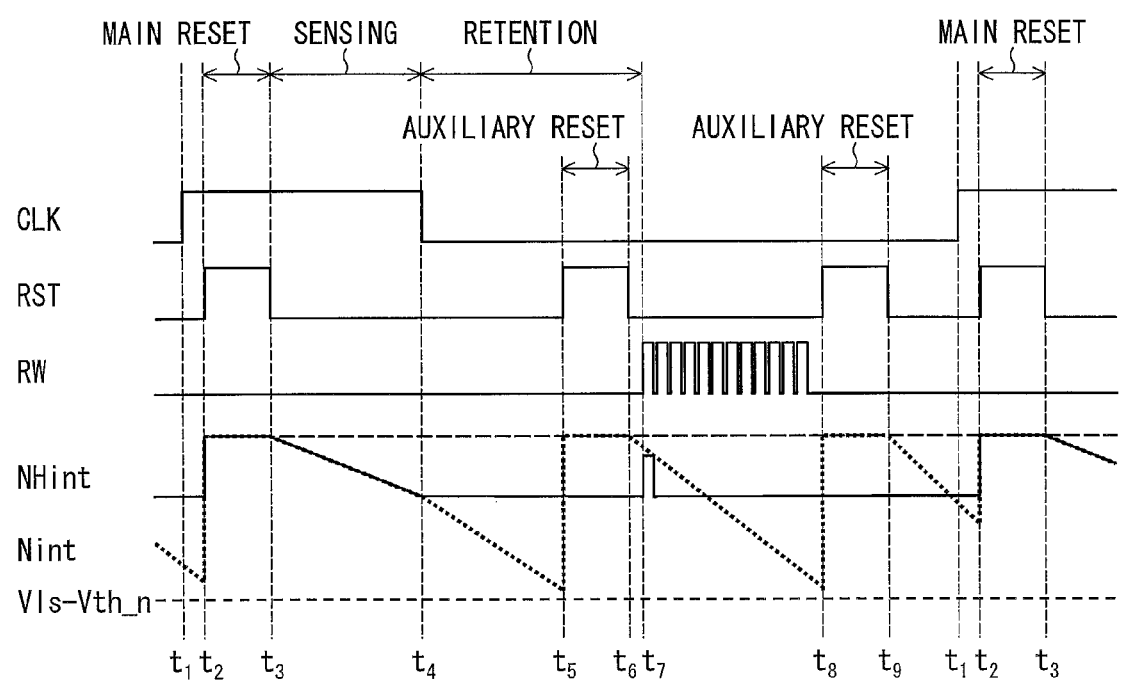

FIG. 13 is a timing chart shown in a case where the optical sensor circuit is operated by a second modification example of the operating method shown in (b) of FIG. 10.

Figure 14:
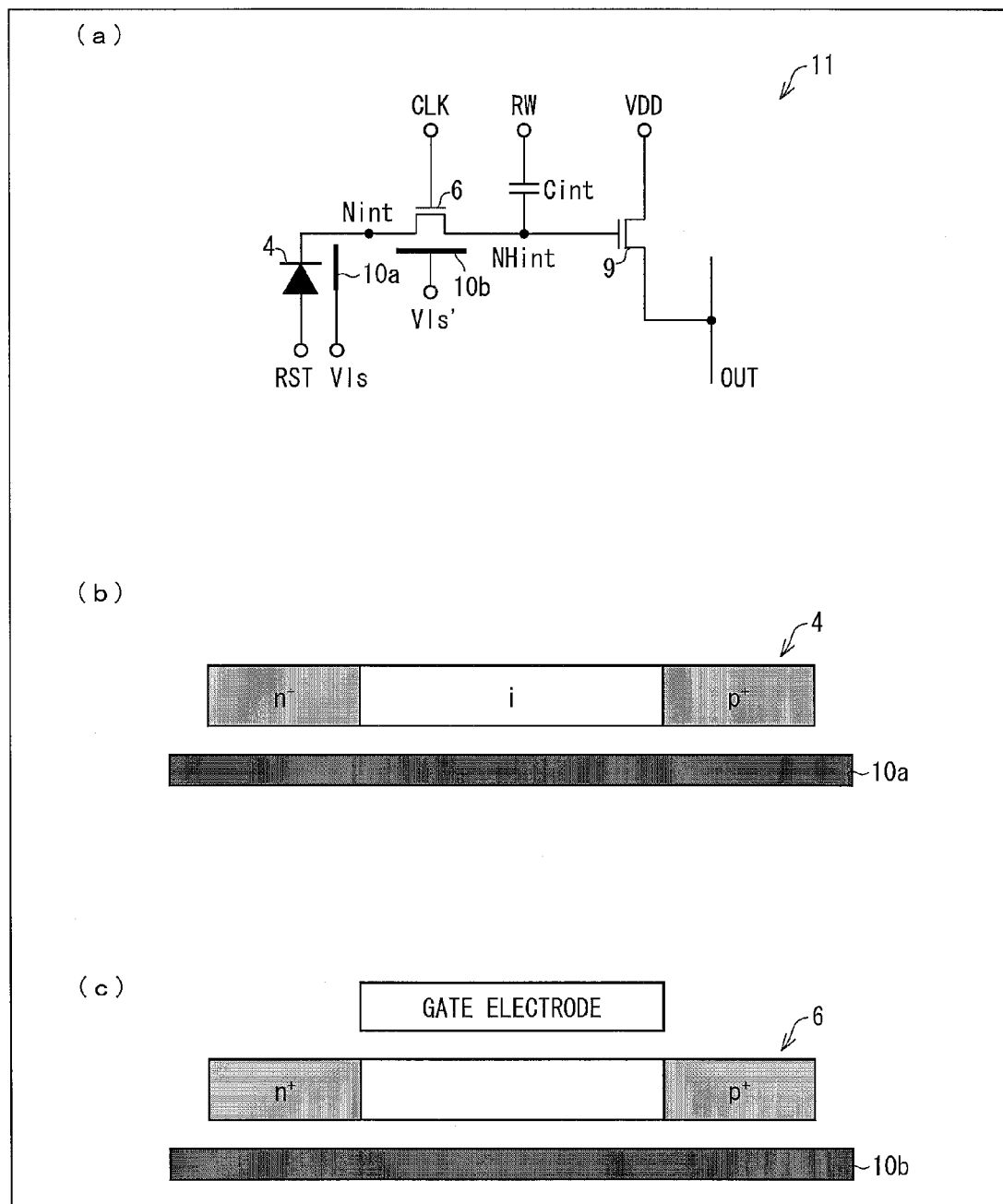

FIG. 14 is a view illustrating a modification example.

Figure 15:
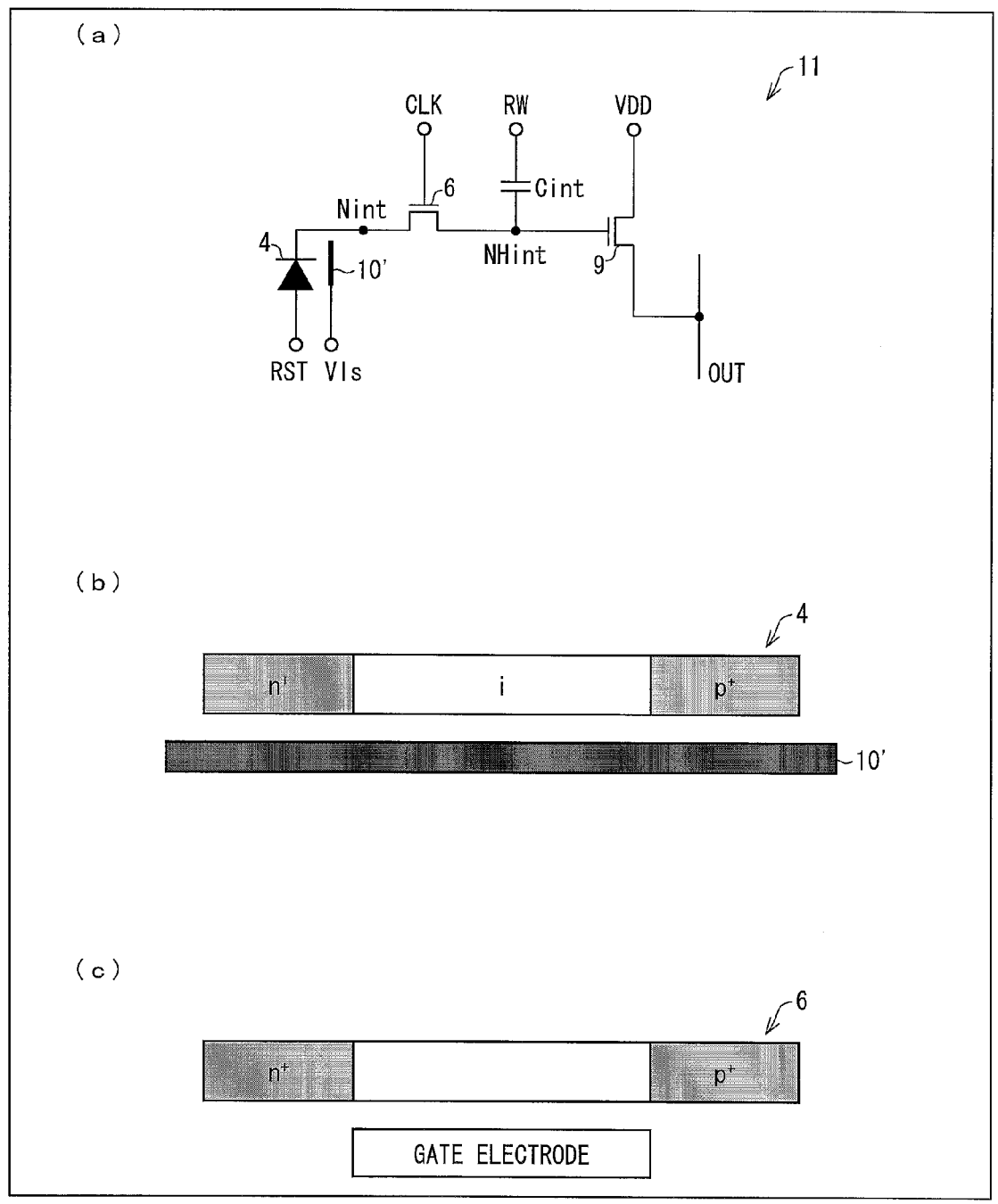

FIG. 15 is a view illustrating a modification example.

FIG. 16 is a circuit diagram illustrating another embodiment of an optical sensor circuit according to the present invention.

Figure 17:
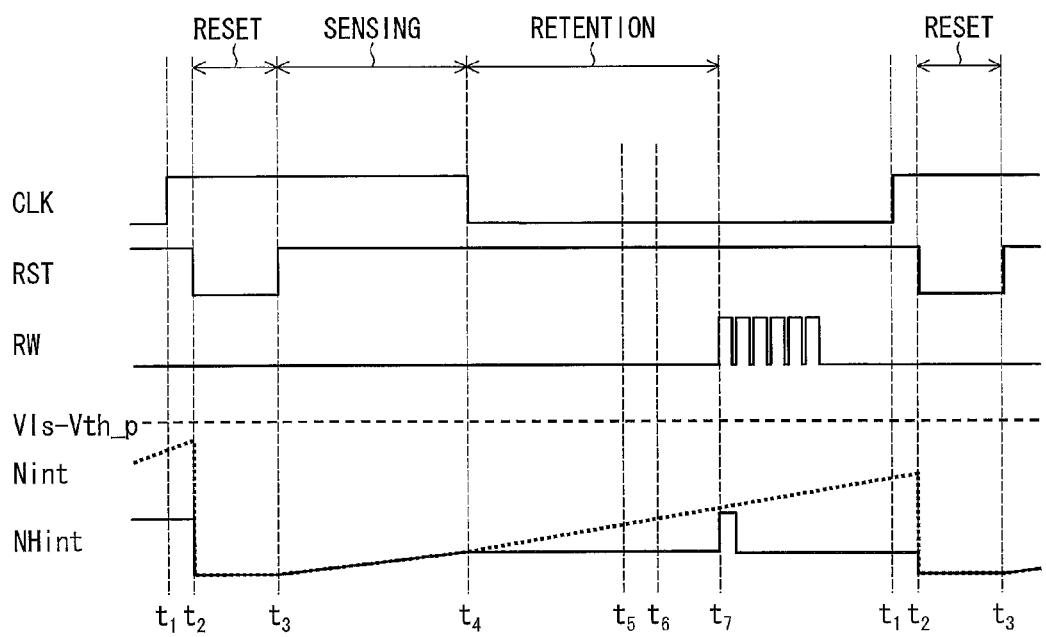

FIG. 17 is a timing chart when the amount of incident light is small in a case where the optical sensor circuit illustrated in FIG. 16 is operated by a general operating method.

Figure 18:
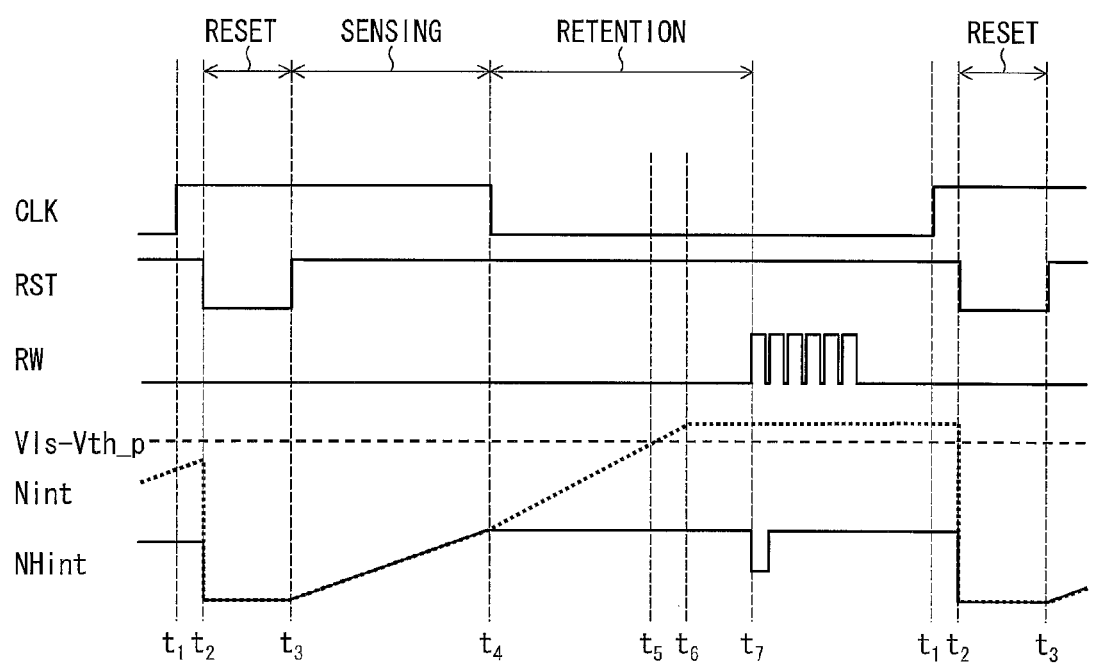

FIG. 18 is a timing chart when the amount of incident light is large in a case where the optical sensor circuit illustrated in FIG. 16 is operated by a general operating method.

FIG. 19 is view showing a problem that is arisen in a case where an optical sensor circuit is driven by the general method shown in FIG. 18.

FIG. 20 is a timing chart shown in a case where the optical sensor circuit illustrated in FIG. 16 is operated in another embodiment of an operating method according to the present invention.

FIG. 21 is a timing chart in a case where the optical sensor circuit is operated by a method of a first modification example of the operating method illustrated in FIG. 20.

Figure 22:
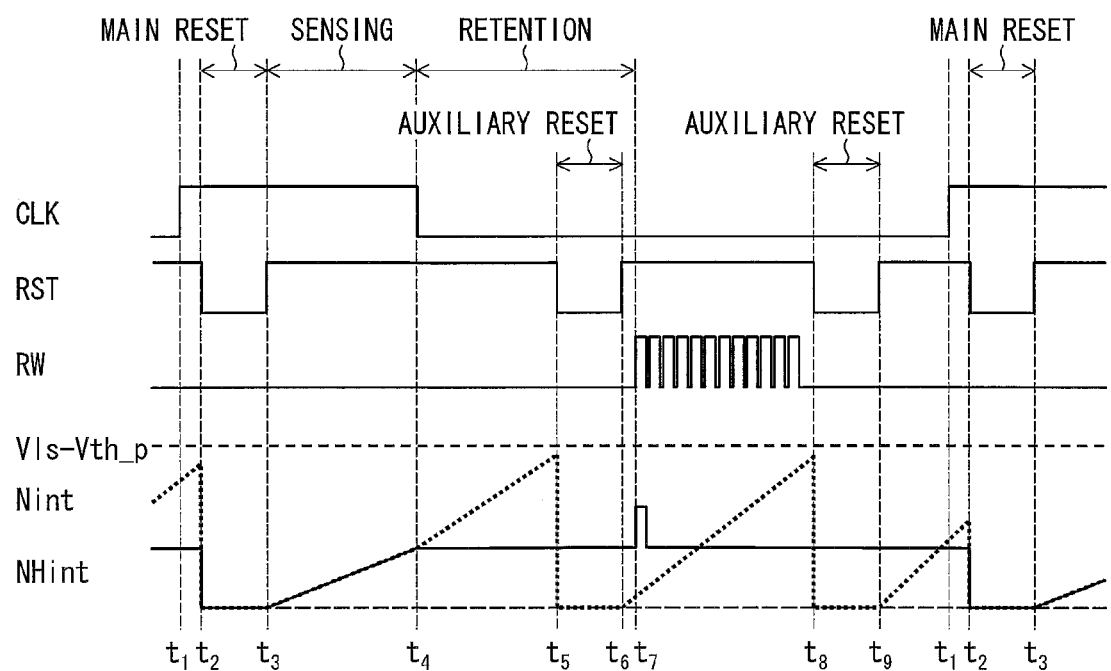

FIG. 22 is a timing chart in a case where the optical sensor circuit is operated by a method of a second modification example of the operating method illustrated in FIG. 20.

Figure 23:
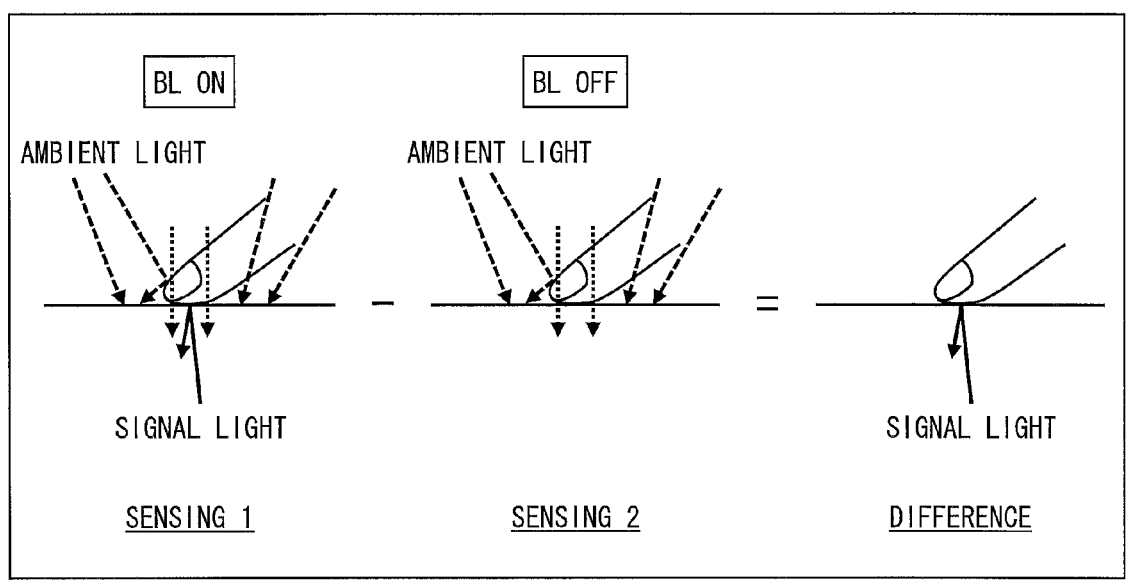

FIG. 23 is a schematic view illustrating optical sensing with use of an optical sensor circuit of one embodiment according to the present invention.

Figure 24:
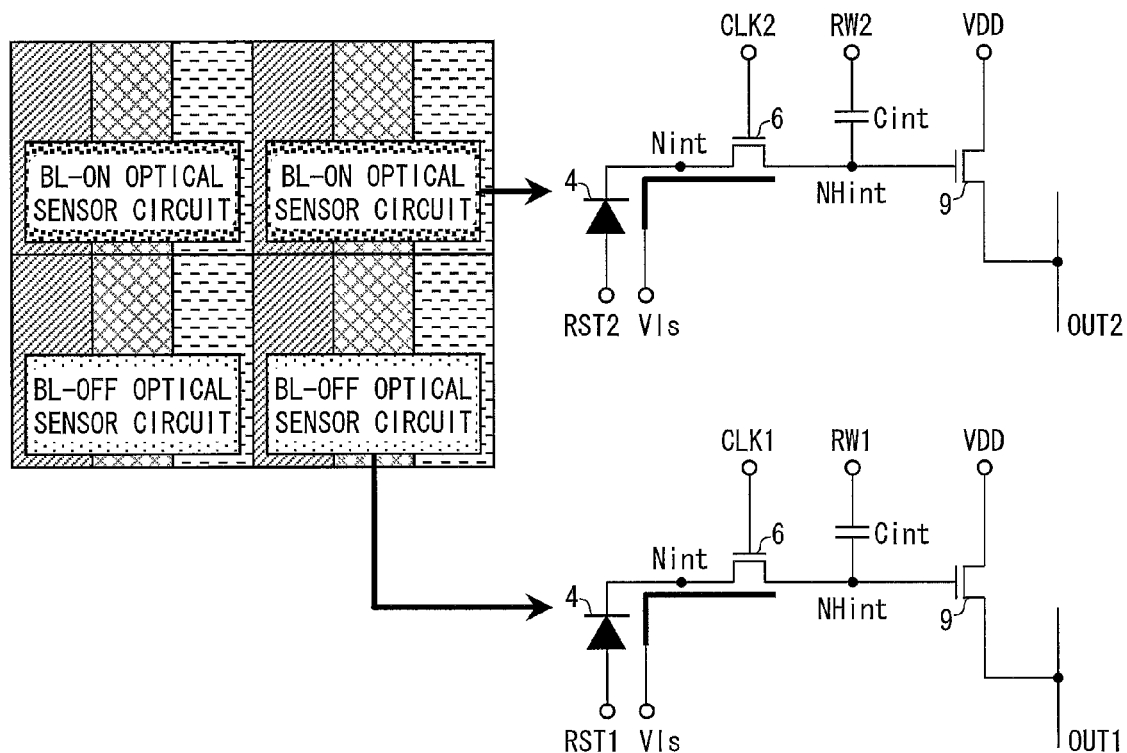

FIG. 24 schematically illustrates a part of a display section of a liquid crystal display device on which an optical sensor circuit of one embodiment according to the present invention is mounted, and illustrates a circuit diagram of the optical sensor circuit mounted on the display section.

FIG. 25 is a timing chart illustrating an operation of the liquid crystal display device illustrated in FIG. 24.

Figure 26:
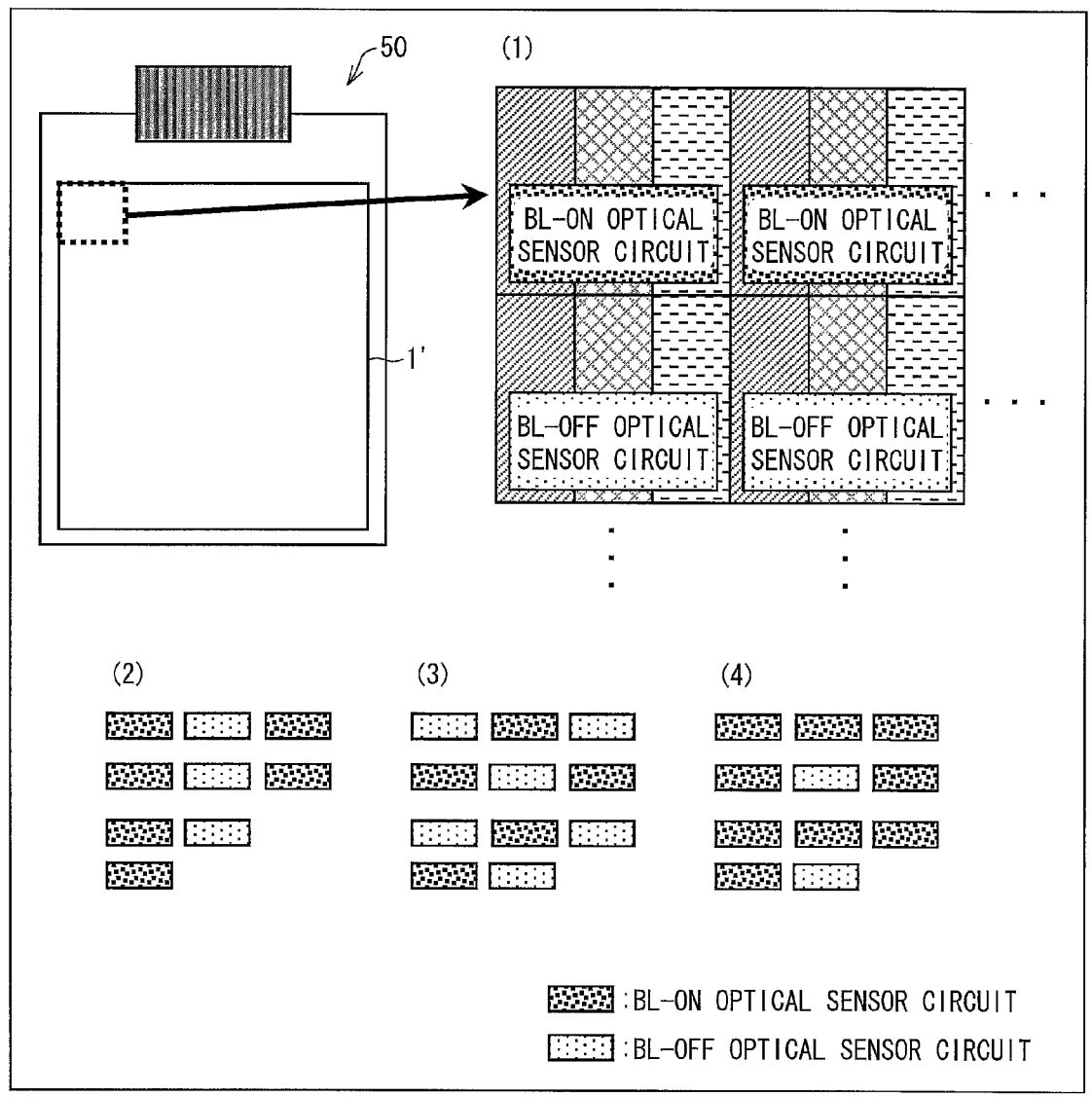

FIG. 26 is a view schematically illustrating the display section of the liquid crystal display device illustrated in FIG. 24 and a modification example thereof.

Figure 27:
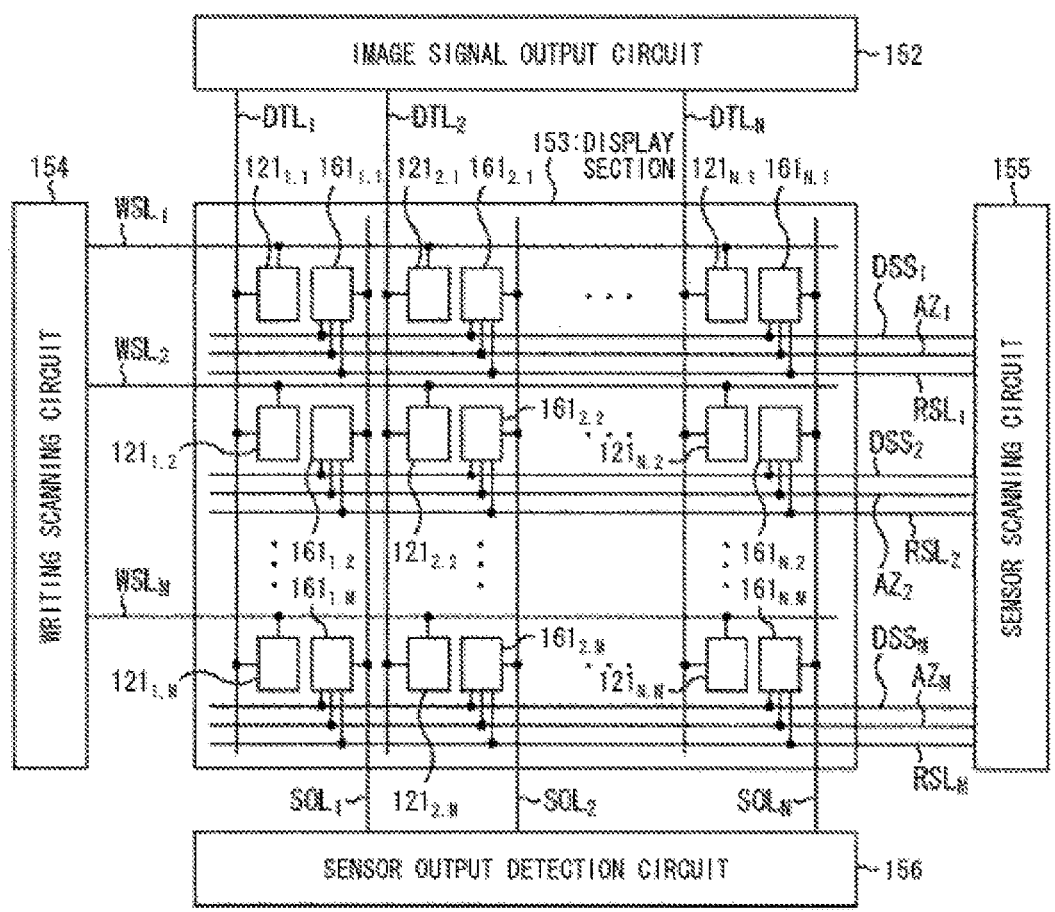

FIG. 27 is view illustrating a conventional configuration.

Figure 28:
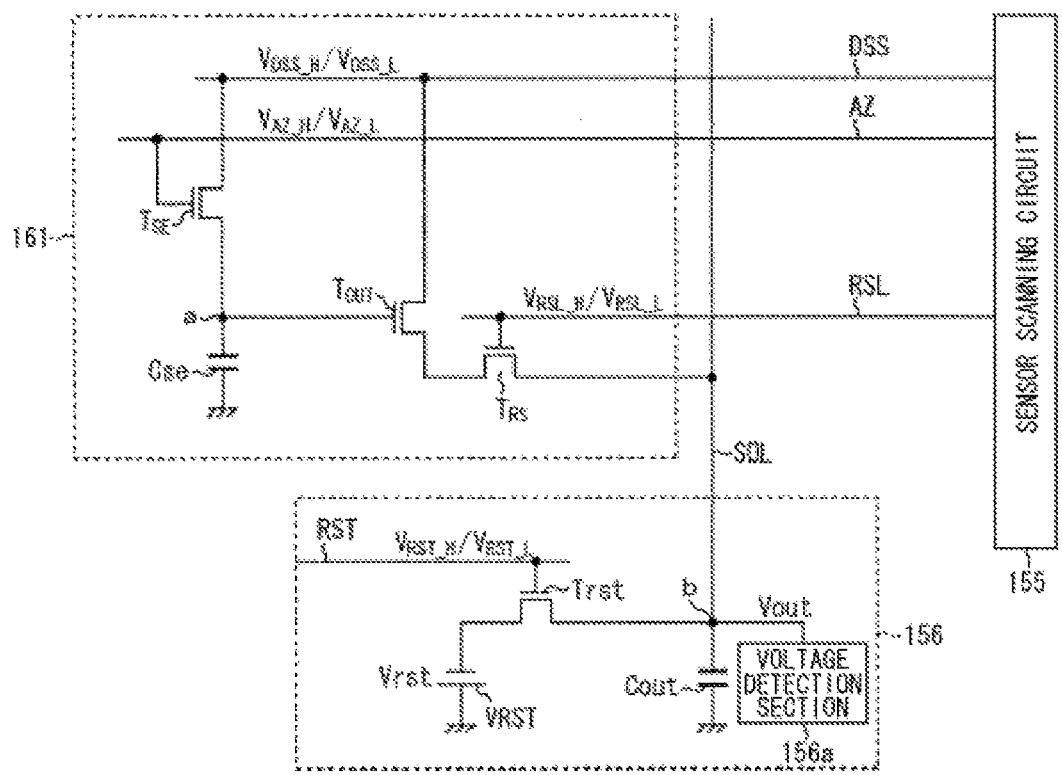

FIG. 28 is view illustrating a conventional configuration.

Figure 29:
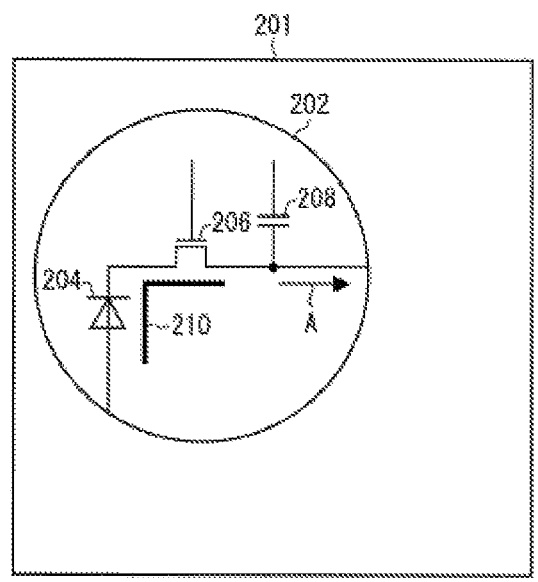

FIG. 29 is view illustrating a conventional configuration.

DESCRIPTION OF EMBODIMENTS

Embodiment 1

The following description will discuss one embodiment of a method of operating an optical sensor circuit according to the present invention. First, the description will discuss a configuration of a liquid crystal display device on which the optical sensor circuit of this embodiment is mounted.

1. Configuration of Liquid Crystal Display Device of this Embodiment

FIG. 1 is a view illustrating a circuit configuration in a pixel of a display section of a liquid crystal display device.

The liquid crystal display device is an active-matrix display device, and includes: a display section 1; a gate driver as a scanning signal line driving circuit; a source driver as a data signal line driving circuit; a storage capacitor wiring driving circuit; an external driving circuit for driving and controlling the gate driver, the source driver, the storage capacitor wiring driving circuit, and a common electrode. The liquid crystal display device performs gate line interval driving as AC driving. Further, a polarity of a storage capacitor potential to be applied to the storage capacitor wiring CsL is inverted between a period in which positive data is supplied to a panel and a period in which negative data is supplied to the panel, and this inversion is carried out the storage capacitor wiring CsL.

The display section 1 includes: gate lines GL as a plurality of (n) scanning signal lines; source lines SL as a plurality of (m) data signal lines that intersect the gate lines GL, respectively; a plurality of (n×m) picture elements PIX provided corresponding to intersections of the gate lines GL and the source lines SL, respectively; and storage capacitor wiring CsL in parallel to the gate lines GL and the storage capacitor wiring CsL is allotted to a picture element row including the m picture elements PIX arranged in the direction.

In this embodiment, a single display circuit, i.e., a single pixel includes three picture elements PIX of red (R), green (G), and blue (B). Each of the picture elements PIX includes a pixel TFT 21, a liquid crystal capacitor CL, and an auxiliary capacitance Cs, as illustrated in FIG. 1. A gate of the pixel TFT 21 is connected to a gate line GL, a source thereof is connected to a source line SL, and a drain thereof is connected to a picture element electrode. The liquid crystal capacitor CL is a capacitor that is formed by arranging a liquid crystal layer between the picture element electrode and the common electrode. The auxiliary capacitance Cs is a capacitance that is formed by arranging an insulating film between the picture element electrode and the storage capacitor wiring CsL. A common potential generated in an electric power circuit that the external driving circuit includes is applied to the common electrode. Between a high-level voltage and a low-level voltage, which are generated in the electric power circuit that the external driving circuit includes and are supplied to the storage capacitor wiring driving circuit, a storage capacitor potential that is generated for each storage capacitor CsL by the storage capacitor wiring driving circuit is applied to the storage capacitor wiring CsL. The liquid crystal capacitor CL and the auxiliary capacitance Cs configures a picture element capacitance, whereas there are, as other capacitances configuring the picture element capacitances, a parasitic capacitance formed between the picture element electrode and the gate line GL, a parasitic capacitor formed between the common electrode and the source line SL, a parasitic capacitance formed between the storage capacitor wiring CsL and the source line SL, etc.

In each pixel, an optical sensor circuit is provided to be adjacent to a display circuit. In this embodiment, a single optical sensor circuit 11 is provided corresponding to a single display circuit 12 (one pixel) including three picture elements PIX of red (R), green (G), and blue (B). By providing a plurality of optical sensor circuits 11 in the display section 1, a touch screen function is achieved. Note that a driving circuit for receiving an output from the optical sensor circuit 11 and processing the output is mounted on the above liquid crystal display device. Note that the driving circuit may be formed on an FPC mounted on the liquid crystal display device, or may be formed on an external substrate.

As illustrated in FIG. 1, the optical sensor circuit 11 includes: a PIN diode 4; a data retaining TFT 6 (thin film transistor); a storage capacitor Cint; a data writing-out TFT 9; and a light-blocking layer 10.

An anode terminal of the PIN diode 4 is connected to a reset scanning line RST, whereas a cathode terminal thereof is connected to a source of the data retaining TFT 6, and a potential of the cathode terminal is changed in accordance with electric charges that have been generated in proportion to an amount of incident light. The electric charges are outputted as electric signals from the PIN diode 4 and retained by the data retaining TFT 6.

A source of the data retaining TFT 6 is connected to a cathode terminal of the PIN diode 4, whereas a gate thereof is connected to a signal line CLK for supplying an on/off signal of the data retaining TFT 6, and a drain thereof is connected to the storage capacitor Cint. During resetting and sensing, the cathode terminal of the PIN diode 4 and a storage node NHint are connected to each other to thereby store electric charges (=data) in the storage capacitor Cint. Meanwhile, during retaining of the data and writing of the data, the electric charge (=data) stored in the storage capacitor Cint is retained by the cathode terminal of the PIN diode 4 and the storage node NHint are not connected to thereby retain.

The storage capacitor Cint is connected to the data retaining TFT 6, and is provided for retaining electric charges retained by the data retaining TFT 6. Further, the storage capacitor Cint is connected to a writing-out signal line RW.

A gate of the data writing-out TFT 9 is connected to the data retaining TFT 6 and the storage capacitor Cint. A source of the data writing-out TFT 9 is connected to power supply wiring VDD, whereas the drain thereof is connected to an optical sensor output line OUT. Note that, in this embodiment the power supply wiring VDD and the optical sensor output line OUT are configured by using a configuration of the source line SL of the display circuit. The source of the data writing-out TFT 9 is connected to a power supply, and is designed to always operate in a saturated region. In the saturated region, a drain current of the data writing-out TFT 9 is controlled by a voltage between the gate and the source. In view of the circumstances, upon receipt of a writing-out signal from the writing-out signal line RW, the storage capacitor Cint changes a gate application voltage of the data writing-out TFT 9 in accordance with a storage node voltage and then outputs the current.

The light-blocking layer 10 is provided to be close to the PIN diode 4 and the TFT 6 so as to block light incident on the PIN diode 4 and the TFT 6 from backlight that is provided as a light source device on a back surface of the display circuit. The light-blocking layer 10 can prevent light incident directly on the PIN diode 4 from the backlight, and also prevent an off-leak current that is caused by incident of light upon the TFT 6 and generation of carriers. That is, it is possible to reduce an off-leak current in a data retaining period of the TFT 6.

The following description will discuss the light-blocking layer 10 and the PIN diode 4 in detail with reference to FIG. 2. It can be said that the light-blocking layer 10 and the PIN diode 4 configure a photodiode. At a bottom layer of the photodiode, a conductive light-blocking layer 10 for blocking light incident from a back surface is provided, and the light-blocking layer 10 is connected to a light-blocking-layer fixing voltage Vls. The PIN diode 4 is formed as a semiconductor layer made by PIN junction on the light-blocking layer 10 so that an insulating layer is sandwiched between the PIN diode 4 and the light-blocking layer 10. Further, because natural light is incident on an intrinsic region i (intrinsic) of the PIN diode 4 in a state in which a predetermined voltage is applied between an anode terminal Va and a cathode terminal Vc illustrated in FIG. 2, a photocurrent is generated in proportion to an amount of the incident light. FIG. 3 is a graph showing a photodiode IV characteristic. As shown in FIG. 3, as a bias Vac applied to the photodiode is changed from positive to negative, a current is flown through the photodiode in an opposite direction (region (C) of FIG. 3), and this reverse current is substantially constant with respect to the bias Vac when the reverse current excesses a predetermined voltage V1 (region (B) of FIG. 3). Further, when a magnitude |Vac| of the bias Vac is increased (|V2| or more in FIG. 3), a current is increased due to yield (region (A) in FIG. 3). In optical sensing of this embodiment, the region (B) of FIG. 3 is used.

2. Operation Mode of PIN Diode

A potential in each region of the PIN diode 4 is determined by applied voltages Va, Vc, Vls and by inverted thresholds Vth_n and Vth_p in the intrinsic region of the PIN diode 4. The following description will discuss, by using three modes A, B, C, a relationship among the potentials of the respective regions and the intrinsic region of the PIN diode 4.

Figure 4:
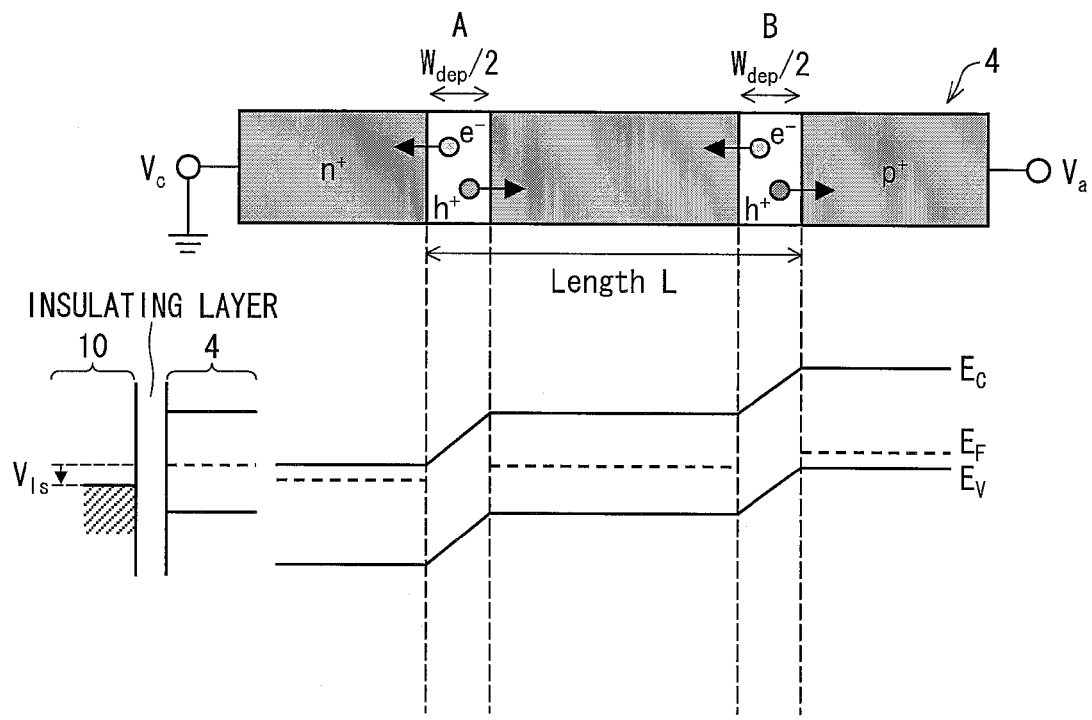
FIG. 4 is an explanatory view of a potential (mode A) of an intrinsic region of a PIN diode.

FIG. 4 is an explanatory view of the mode A. Va, Vc, Vls, Vth_n, Vth_p are set to satisfy (Va+Vth_p)<Vls<(Vc+Vth_n). In this case, depletion regions (A, B of FIG. 4) are formed on N-region and P-region sides, respectively, of the intrinsic region, so that it is possible to achieve a configuration in which the intrinsic region sandwiched between the P region and the N region exists exactly as an intrinsic region. That is, in a case of (Va+Vth_p)<Vls<(Vc+Vth_n), what is provided between the P region and the N region is an intrinsic region. A schematic configuration of the mode A is illustrated in a lower side of FIG. 4, i.e., diodes are provided at both ends of the intrinsic region.

Figure 5:
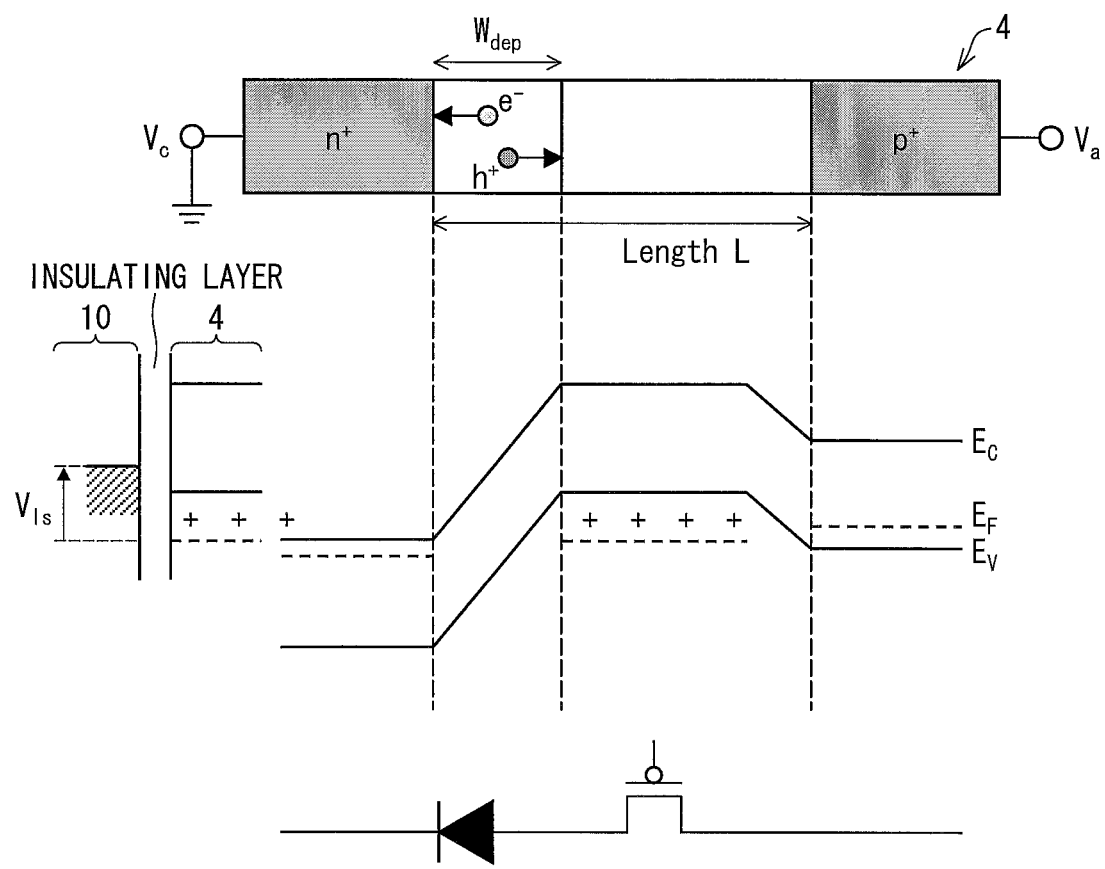
FIG. 5 is an explanatory view of a potential (mode B) of an intrinsic region of a PIN diode.

FIG. 5 is an explanatory view of the mode B. A difference between FIG. 5 and FIG. 4 is only that the mode B satisfies Vls≤(Va+Vth_p)<(Vc+Vth_n). In this case, most of a region sandwiched between the P region and the N region, which is originally intrinsic, is inverted to a P region because of an influence of Vls, i.e., is in a state in which holes are stored, and only a region adjacent to the N region is a depletion region (region indicated by Wdep of FIG. 5). A schematic configuration of the mode B is illustrated in a lower side of FIG. 5, i.e., in the region sandwiched between the P region and the N region, a diode is provided in a region adjacent to the N region, whereas a p-type TFT is provided between the region and the P region.

Figure 6:
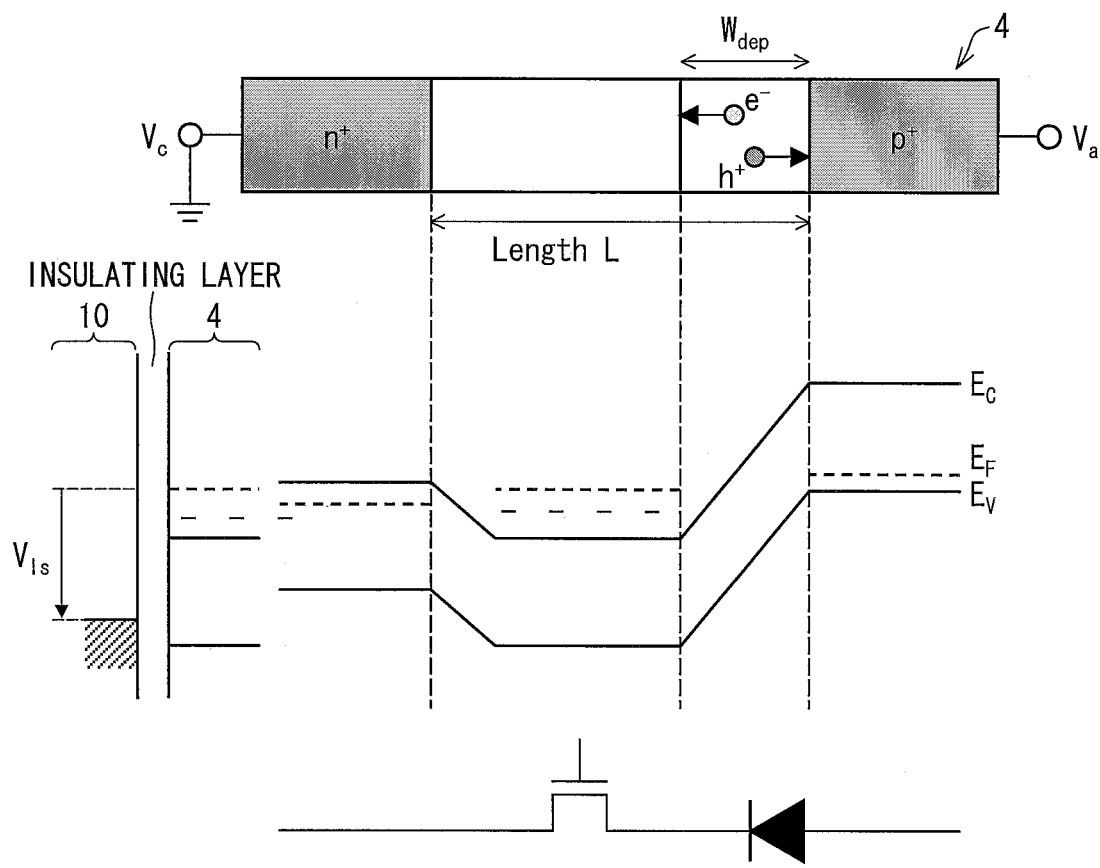
FIG. 6 is an explanatory view of a potential (mode C) of an intrinsic region of a PIN diode.

FIG. 6 is an explanatory view of the mode C. A difference between FIG. 6 and FIG. 4 is only that the mode C satisfies (Va+Vth_p)<(Vc+Vth_n)≤Vls. In this case, most of a region sandwiched between the P region and the N region, which is originally intrinsic, is inverted to an N region because of an influence of Vls, i.e., is in a state in which electrons are stored, and only a region adjacent to the P region is a depletion region (region indicated by Wdep of FIG. 6). A schematic configuration of the mode B is illustrated in a lower side of FIG. 6, i.e., in the region sandwiched between the P region and the N region, a diode is provided in a region adjacent to the P region, whereas an n-type TFT is provided between the region and the N region.

3. Operation Example and Problem of General Optical Sensor Circuit

The following description will discuss a state of the PIN diode 4 in a practical driving example (practical operation example) of the optical sensor circuit 11 illustrated in FIG. 1. First, a general driving example (operation example) will be described. In the general operation example, operations such as reset for initializing a storage node prior to sensing, the sensing after the reset, retaining a result of the sensing, and writing out data thus retained are carried out in series.

(a) of FIG. 7 is a circuit diagram illustrating a configuration of the optical sensor circuit 11 also illustrated in FIG. 1, and (b) of FIG. 7 is a timing chart of a general operation example of the optical sensor circuit 11.

In the timing chart of (b) of FIG. 7, by applying a voltage to the gate of the data retaining TFT 6 at a time $t_1$, the data retaining TFT 6 is turned on. Then, when a potential supplied to the anode terminal of the PIN diode 4 via the reset scanning line RST becomes high between a time $t_2$ and a time $t_3$, a cathode section of the PIN diode and the storage node are discharged, and the PIN diode and the storage node are set to an initial potential. During a period between the time $t_2$ and the time $t_3$, which is a reset period, it is assumed that, for example, Va is 0 V, Vc is about 0 V, and Vls is −1.5 V. In this case, assuming that Va+Vth_p is −2 V and Vc+Vth_n is 2 V, the PIN diode is operated in the mode A on the basis of a relationship between those values and Vls. Va becomes −5 V at the time $t_3$, and the reset period is completed.

The following operations will be discussed in terms of a case where the amount of incident light is small and a case where the amount of incident light is large.

In a case where the amount of incident light is small, sensing is performed during a period between a time $t_3$ and a time $t_4$. During this period, electric charges (=data) are stored in the storage capacitor Cint. The data retaining TFT 6 is turned off at the time $t_4$, and the sensing is completed. Thereafter, the electric charges (=data) in the storage capacitor Cint are retained during a period between the time $t_4$ and a time $t_7$, meanwhile, and electric charges are kept being stored in Nint. When a writing-out voltage becomes high via the writing-out signal line RW at the time $t_7$, the data writing-out TFT 9 is turned on, and a current generated in accordance with the electric charges (=data) stored in the storage capacitor Cint is flown through the data writing-out TFT 9 and is outputted OUT. Then, a voltage is applied to the gate of the data retaining TFT 6 at a next time $t_1$ in order to prepare the next sensing, thereby turning on the TFT 6 thereof, and then the reset is performed. Between the time $t_3$ and a next time $t_2$, for example, Va=−5 V, Vls−Vth_n<Vc<0 V, and Vls=−1.5 V are assumed. In this case, the period have Va+Vth_p=−7 V and Vls=−1.5 V<Vc+Vth_n, and the PIN diode is operated in the mode A.

That is, in a case where the amount of incident light is small, the PIN diode is constantly driven (operated) in the mode A.

The following description will discuss the case where the amount of incident light is large with reference to FIG. 8. A difference between the case where the amount is small and the case where the amount is large appears remarkably from and after a time $t_5$ in FIG. 8. In other words, during a period between a time $t_1$ at which a photodiode is initially driven and a time $t_4$ (from initial reset to sensing), the PIN diode is driven in the mode A, which is similar to the case where the amount of incident light is small. Further, electric charges (=data) are retained in the storage capacitor Cint, whereas, in beginning of a period in which electric charges are kept being stored in Nint, the PIN diode is driven in the mode A, which is similar to the case where the amount of incident light is small. However, as shown in FIG. 8, the cathode potential Nint becomes lower than Vls−Vth_n during a period between the time $t_5$ and a time $t_6$. This will be described specifically as follows. During the period between the time $t_5$ and the time $t_6$, in a case of Va=−5 V, Vc≤Vls−Vth_n, and Vls=−1.5 V, Va+Vth_p becomes −7 V and Vc+Vth_n≤Vls becomes −1.5 V. That is, the PIN diode 4 is operated in the mode C. Similarly, during a period between the time $t_6$ and a next time $t_2$, for example, in a case of Va=−5 V, Vc≈−5 V, and Vls=−1.5 V, Va+Vth_becomes −7 V and Vc+Vth_n≈−3 V<Vls becomes −1.5 V. Therefore, the PIN diode is operated in the mode C.

That is, in a case where the amount of incident light is large, the PIN diode is driven in the mode A and the mode C (mode A→mode C→mode A→ . . . ).

In a case where the amount of incident light is large as described above, the PIN diode is reset from the mode C to the mode A. However, in this case, there is a possibility that the reset period is completed, whereas electrons that have been stored in a region which should have been originally intrinsic in the mode C are partially remained in the region. Therefore, in a case where sensing after the reset is performed, those residual electric charges (electrons) are superposed on a photocurrent (signal) caused by incident light as shown in FIG. 9, which results in outputting a larger current than a desirable amount of current (a line shape indicated by a broken line of the graph) which should be originally outputted.

4. Method of Operating Optical Sensor Circuit of this Embodiment

In view of the circumstances, in this embodiment, in order to achieve such a problem, a bias state is maintained so that electric charges (electrons) are not inconveniently stored in the intrinsic region of the PIN diode 4, which can prevent influence on the signal.

Specifically, in this embodiment, in addition to the reset needed prior to the sensing, additional reset is performed at another timing. This can reduce a potential of a cathode terminal whose potential shifts in accordance with incident light within a predetermined range within which storage of electric charges is not induced.

The following description will discuss this characteristic configuration. In the following description, the reset needed prior to the sensing is referred to as "main reset", and the additional reset performed at a different timing from that of the main reset is referred to as "auxiliary reset".

FIG. 10 is an explanatory view of a characteristic method of driving (method of operating) the PIN diode 4 which is performed in this embodiment. (a) of FIG. 10 is a circuit diagram (identical with FIG. 1 and (a) of FIG. 7) illustrating a configuration of the optical sensor circuit 11, and (b) of FIG. 10 is a timing chart showing the method of driving the PIN diode 4.

As shown in (b) of FIG. 10, in this embodiment, the auxiliary reset for supplying a reset signal to an anode terminal of the PIN diode 4 via the reset scanning line RST is performed at a certain timing between main reset and another main reset, specifically, herein, in a latter half of a period in which electric charges (=data) are stored in the storage capacitor Cint, i.e., before a writing-out voltage is supplied to the storage capacitor Cint via the writing-out signal line RW to thereby increase the storage capacitor Cint. The auxiliary reset is started (time $t_5$) when the cathode potential Nint is not lower than Vls−Vth_n. Thereafter, the auxiliary reset is completed (time $t_6$) after Nint is sufficiently discharged, and a timing of completing the auxiliary reset is desirably a moment at which the completion of the auxiliary reset does not interfere another operation, specifically, in (b) of FIG. 10, a timing before the writing-out voltage is supplied to the storage capacitor Cint via the writing-out signal line RW to thereby increase the storage capacitor Cint.

Because of the auxiliary reset, the cathode potential Nint does not become lower than Vls−Vth_n and becomes a reset potential (high). Therefore, even if the cathode potential is reduced again in a data writing-out period from the time $t_7$, the cathode potential does not become lower than Vls−Vth_n, and next main reset is performed. That is, according to the driving method of this embodiment, it is possible to prevent the PIN diode 4 from entering the mode C. This can solve the above problem, and residual electric charges are not superposed on a photocurrent (signal) caused by incident light, and it is possible to output a desirable amount of current (the line shape indicated by the broken line of the graph) which should be originally outputted.

That is, the main reset means an operation of initializing nodes (Nint and NHint) prior to the sensing, in which operation electric charges, which are data signals, generated by photodiodes are stored, i.e., charging or discharging the electric charges prior to sensing so that the electric charges have initial potentials for the sensing. A potential after the reset is determined as a reference, and displacement of the Nint and the NHint caused by the following sensing is recognized as a data signal. That is, the main reset means reset which is performed in a circuit of (a) of FIG. 7 while a retaining transistor is in a on state.

Meanwhile, the auxiliary reset is an operation of retaining a potential of the Nint so that the potential has not less than or not more than a predetermined potential, and is an operation which does not influence original data signals (influence of residual storage electric charges, which is a problem that the present invention is to solve, is not caused by original data signals). That is, the auxiliary reset is reset which is performed in the circuit of (a) of FIG. 7 while the retaining transistor is in an off state.

The following description will discuss an example of a method of determining a timing at which the auxiliary reset is implemented and the number of times the auxiliary reset is implemented. FIG. 11 illustrates a circuit identical with that of (a) of FIG. 7, however, Cp1 of FIG. 11 is a sum total of parasitic capacitors connected to the Nint, Cp2 is a sum total of parasitic capacitors (other than the Cint) connected to Nhint, Ipd and max are photocurrents flown through a photodiode which has received a maximum conceivable incident light, and Na1 and Na2 are sum totals of target nodes of the parasitic capacitors. A photodiode of FIG. 11 is assumed to operate in the (B) region of FIG. 3.

With reference to the timing chart of (b) of FIG. 10, potential changes ΔVsen of the Nint and the Nhint in a sensing ($t_3$ to $t_4$) period Tsen can be represented by the following formula.

$$\Delta Vsen = Ipd,\max \times Tsen/(Cp1+Cp2+Cint)$$

A potential change ΔVsra of the Nint during a period Tsra from completion of sensing to start of auxiliary reset ($t_4$ to $t_5$) can be represented by the following formula.

$$\Delta Vsra = Ipd,\max \times Tsra/Cp1$$

Therefore, a total potential change ΔVrr during a period from completion of the nth main reset to start and implementation of the (n+1)th main reset period can be represented by the following formula.

$$\Delta Vrr = \Delta Vsen + \Delta Vsra = Ipd, \max \times [Tsen/(Cp1 + Cp2 + Cint) + Tsra/Cp1]$$

In view of the circumstances, considering a potential shift caused by ΔVrr to be calculated, timings (Tsen and Tsra) at which the mode A can be maintained are set, which makes it possible to prevent electric charges from being inconveniently stored in the intrinsic region.

Modification Example 1

The above embodiment has discussed a form where the auxiliary reset is performed in the latter half of the period in which the electric charges (=data) are retained in the storage capacitor Cint, i.e., before the writing-out voltage is supplied to the storage capacitor Cint via the writing-out signal line RW to thereby increase the storage capacitor Cint. However, the present invention is not limited thereto.

For example, as shown in a timing chart of Modification Example 1 in FIG. 12, the auxiliary reset may be performed in a period after the writing-out period (period between the time $t_5$ and the time $t_6$) but immediately before a next main reset, more specifically, immediately before the TFT6 is turned on (time $t_1$). Therefore, even if the amount of incident light is large and the cathode potential Nint is lower than Vls−Vth_n in the storage capacitor Cint in the period in which the electric charges (=data) are retained, the cathode potential Nint can be prevented from being lower than Vls−Vth_n before a next main reset. In this case, the electric charges, which were stored in the photodiode until the time $t_6$ and remained even when the auxiliary reset was performed, are removed during a period between the time $t_7$, which is a time after the auxiliary reset is completed, and the next time $t_2$, and cathode potentials immediately before the next main reset are not reduced so much that the cathode potentials store electric charges. As a result, it is possible to prevent transition from the mode C to the mode A in the next main reset, i.e., generation of residual electric charges in the next main reset.

That is, the timing chart of FIG. 12 will be discussed with reference to FIG. 11, and a potential change ΔVras of the Nint in a period Tras from completion of auxiliary reset to start of main reset (time $t_7$ to time $t_2$) can be represented by the following formula.

$$\Delta Vras = Ipd, \max \times Tras/Cp1$$

Considering a potential shift caused by ΔVras to be calculated, a timing (Tras) at which the mode A is can be maintained is set, which makes it possible to prevent electric charges from being inconveniently stored in the intrinsic region.

Modification Example 2

The above embodiment and Modification Example 1 are both forms in which auxiliary reset is implemented once between main reset and next main reset. However, the present invention is not limited thereto, and auxiliary reset may be performed a plurality of times between main reset and next main reset.

FIG. 13 shows a timing chart of Modification Example 2, the auxiliary reset is performed twice between main reset and next main reset.

Specifically, as shown in FIG. 13, first auxiliary reset (between the time $t_5$ and the time $t_6$) is performed in the latter half (between the time $t_5$ and the time $t_6$) of the period (between the time $t_4$ and the time $t_7$) in which electric charges (=data) are retained in the storage capacitor Cint, i.e., before the writing-out voltage is supplied to the storage capacitor Cint via the writing-out signal line RW to thereby increase the storage capacitor Cint, and then second auxiliary reset (between a time $t_8$ and a time $t_9$) is performed in a period not before a writing-out period (between the time $t_7$ and the time $t_8$) but immediately before a next main reset, more specifically, immediately before the TFT6 is turned on (time $t_1$).

According to the driving method, it is possible to prevent the PIN diode 4 from being driven in the mode C, and also to prevent residual electric charges from being generated in next main reset.

That is, the timing chart of FIG. 13 will be discussed with reference to FIG. 11. Driving between the time $t_3$ and the time $t_5$ is identical with that shown in (b) of FIG. 10, and driving between the time $t_9$ and the time $t_2$ is identical with that shown in FIG. 12, however, a potential change ΔVra12 of the Nint during a period Tra12 between completion of the first auxiliary reset and start of the second auxiliary reset (between the time $t_6$ and the time $t_8$) is represented by the following formula.

$$\Delta Vra12 = Ipd, \max \times Tra12/Cp1$$

Considering a potential shift caused by ΔVra12 to be calculated, a timing (Tra12) at which the mode A can be maintained is set, which makes it possible to prevent electric charges from being inconveniently stored in the intrinsic region.

Here, a degree of decrease of Nint is different between (b) of FIG. 10 and FIG. 13. The degree of decrease is changed in proportion to the amount of incident light, Nint, and a capacitor connected to the NHint. The capacitor is uniquely determined depending on a layout of a circuit or a device configuration. Further, the photodiode current (Ipd) is uniquely determined depending on the amount of incident light and a photodiode capability (size and characteristic). Therefore, a timing of auxiliary reset is set considering a potential shift of the Nint under strictest conditions by using (i) the capacitor having a minimum value in consideration of process variations and (ii) Ipd as a conceivable maximum incident light and also as a maximum sensitivity value of capability variation.

Modification Example 3

This embodiment has discussed a form in which the single light-blocking layer 10 blocks light incident on the PIN diode 4 and the data retaining TFT 6, however, the present invention is not limited thereto, and there may be employed a form in which a light-blocking layer is divided into two layers, i.e., one for the PIN diode 4 and the other for the data retaining TFT 6 and different voltages are applied thereto. FIG. 14 is views illustrating this modification example, and, as illustrated in (a) of FIG. 14, a first light-blocking layer 10*a* for blocking light from the PIN diode 4 and a second light-blocking layer 10*b* for blocking light from the data retaining TFT 6 are provided. (b) of FIG. 14 is a view schematically illustrating the PIN diode 4 and the first light-blocking layer 10a of this modification example, and (c) of FIG. 14 is a view schematically illustrating the data retaining TFT 6 and the second light-blocking layer 10b of this modification example. As shown in FIG. 14, by dividing the light-blocking layer and applying different voltages, it is possible to control a threshold value of the data retaining TFT 6.

Modification Example 4

This embodiment has discussed a form in which the single light-blocking layer 10 blocks light from the PIN diode 4 and the data retaining TFT 6, the present invention is not limited thereto, and it is possible to use the gate electrode of the data retaining TFT 6 as a light-blocking layer. In this case, it is unnecessary to provide a light-blocking layer for the data retaining TFT 6 ((c) of FIG. 15), and a light-blocking layer 10" may be placed to block light from the PIN diode 4 only, as illustrated in FIG. 15 ((a) and (b) of FIG. 15).

5. Effect of this Embodiment

As described above, according to the method of driving (method of operating) an optical sensor circuit of this embodiment, between an anode terminal and a cathode terminal of a PIN diode, a potential of the cathode terminal whose potential is changed in proportion to the amount of incident light can be set within a predetermined range within which storage of electrons is not induced in an intrinsic region of the PIN diode immediately before main reset in particular, specifically, the potential can be set to be larger than a value represented by Vls−Vth_n immediately before main reset in particular. This makes it possible to prevent electric charges from being inconveniently stored in the intrinsic region of the photodiode, and residual electric charges are not generated in main reset performed immediately before next sensing. Therefore, it is possible to prevent residual electric charges from being superposed on a photocurrent which is original data at the time of sensing, and, as described above, it is possible to maintain a relationship between the sensor output and the amount of incident light in a straight-line shape.

Embodiment 2

The following description will discuss another embodiment of a method of operating an optical sensor circuit according to the present invention. Note that, for the sake of easy explanation, members having the like functions as the figures described in Embodiment 1 are denoted by the like reference signs and the detailed description thereof is omitted.

1. Configuration of Liquid Crystal Display Device of this Embodiment

FIG. 16 is a circuit diagram illustrating an optical sensor circuit of this embodiment. In the above Embodiment 1, the potential of the cathode terminal of the PIN diode 4 is changed by electric charges generated in proportion to the amount of incident light. On the contrary, in the optical sensor circuit of this embodiment, a potential of an anode terminal of the PIN diode 4 is changed by electric charges generated in proportion to an amount of incident light. Specifically, as shown in FIG. 16, a cathode terminal of a PIN diode 4' is connected to a reset scanning line RST and an anode terminal thereof is connected to the source of the data retaining TFT 6.

2. Operation Mode of PIN Diode

Also in the optical sensor circuit of this embodiment, there is a possibility that, as discussed in the above Embodiment 1, in a general driving example, all electric charges (holes) stored in a region which should be originally intrinsic cannot be removed from the region depending on the amount of incident light. This point will be discussed as follows.

Potentials of regions of the PIN diode 4" are determined by applied voltages Va, Vc, Vls, and inverted thresholds Vth_n and Vth_p in an intrinsic region of the PIN diode 4'. A relationship among the potentials of the regions and the intrinsic region of the PIN diode 4' are similar to those in three modes, i.e., the modes A, B, and C of FIGS. 4 to 6.

3. Operation Example and Problem of General Optical Sensor Circuit

The following description will discuss a state of the PIN diode 4 in a practical driving example (practical operation example) of the optical sensor circuit 11" illustrated in FIG. 16. In the following description of a general driving example (operation example), reset for initializing a storage node is performed immediately before sensing in an optical sensor circuit.

FIG. 17 is a timing chart of a general driving example of the optical sensor circuit 11'. In the timing chart of FIG. 17, a voltage is applied to a gate of the data retaining TFT 6 at a time $t_1$ to thereby turn on the data retaining TFT 6. Then, between a time $t_2$ and a time $t_3$, a potential is applied to the cathode terminal of the PIN diode 4 via the reset scanning line RST to thereby become low, an anode potential section of the PIN diode and a storage node are discharged and the PIN diode and a storage node are set to have initial potentials. During a period between the time $t_2$ and the time $t_3$, which is a reset period, it is assume that, for example, Vc is −5 V, Va is about −5 V, and Vls is −3.5 V. In this case, assuming that Va+Vth_p=−7 V and Vc+Vth_n=−3 V, the PIN diode is operated in the mode A on the basis of a relationship between those values and Vls. Vc becomes 0 V at the time $t_3$ and a reset period is completed.

The following operations will be discussed in terms of a case where the amount of incident light is small and a case where the amount of incident light is large.

In a case where the amount of incident light is small, sensing is performed during a period between a time $t_3$ and a time $t_4$. During this period, electric charges (=data) are stored in the storage capacitor Cint. The data retaining TFT 6 is turned off at the time $t_4$, and the sensing is completed. Thereafter, the electric charges (=data) are retained in the storage capacitor Cint during a period between the time $t_4$ and a time $t_7$, meanwhile, and electric charges are kept being stored in Nint. When a writing-out voltage becomes high via the writing-out signal line RW at the time $t_7$, the data writing-out TFT 9 is turned on, and a current is flown through the data writing-out TFT 9 in accordance with the electric charges (=data) stored in the storage capacitor Cint and is outputted OUT. Then, a voltage is applied to the gate of the data retaining TFT 6 at a next time $t_1$ in order to prepare the next sensing, thereby turning on the TFT 6 thereof, and then the reset is performed. Between the time $t_2$ and the time $t_3$, for example, $Vc=0$ V, $-5$ V$<Va<$Vls$-$Vth_p, and Vls$=-3.5$ V are assumed. In this case, $Vc+Vth\_n$ is 2 V and $Va+Vth\_p<Vls$ is $-3.5$ V, and the PIN diode is operated in the mode A.

That is, in a case where the amount of incident light is small, the PIN diode is constantly driven (operated) in the mode A.

The following description will discuss the case where the amount of incident light is large with reference to FIG. 18. A difference between the case where the amount is small and the case where the amount is large becomes large appears remarkably from and after a time $t_5$ in FIG. 18. In other words, during a period between a time $t_1$ at which a photodiode is initially driven and a time $t_4$ (from initial reset to sensing), the PIN diode is driven in the mode A, which is similar to the case where the amount of incident light is small. Further, in beginning of a period in which electric charges (data) are stored in the storage capacitor Cint, the PIN diode is driven in the mode A, which is similar to the case where the amount of incident light is small. However, as shown in FIG. 18, the anode potential Nint is higher than Vls$-$Vth_p during a period between the time $t_5$ and a time $t_6$. For example, during the period between the time $t_5$ and the time $t_6$, in a case of $Vc=0$ V, Vls$-$Vth_p$\leq$Va, and Vls$=-3.5$ V, Vls$\leq$Va$+$Vth_p and $Vc+Vth\_n=2$ V, and the PIN diode 4' is operated in the mode B. Similarly, during a period between the time $t_6$ and a next time $t_2$, for example, in a case of $Vc=0$ V, Va$\approx$0 V, and Vls$=-3.5$ V, Va$+$Vth_p becomes $-2$ V and $Vc+Vth\_n$ becomes 2 V. Therefore, the PIN diode 4' is operated in the mode B.

That is, in a case where the amount of incident light is large, the PIN diode is driven in the mode A and the mode B (mode A→mode B→mode A→ . . . ).

In a case where the amount of incident light is large as described above, the PIN diode is reset from the mode B to the mode A. However, in this case, there is a possibility that the reset period is completed, whereas holes that have been stored in a region which should have been originally intrinsic in the mode B are partially remained in the region. Therefore, in a case where sensing after the reset is performed, those residual electric charges (holes) offset a photocurrent (signal) caused by incident light as shown in FIG. 19, which results in outputting a smaller current than a desirable amount of current (a line shape indicated by a broken line of the graph) which should be originally outputted.

4. Method of Operating Optical Sensor Circuit of this Embodiment

In view of the circumstances, in this embodiment, in order to achieve such a problem, a bias state is maintained so that electric charges are not stored in the intrinsic region of the PIN diode 4', which can prevent influence of such stored electric charges on signals. Specifically, in this embodiment, in addition to main reset which is needed prior to the sensing, auxiliary reset is performed at another timing. This can reduce a potential of an anode terminal whose potential shifts in accordance with incident light within a predetermined range within which storage of electric charges is not induced.

FIG. 20 is a timing chart of a characteristic method of driving (method of operating) the PIN diode 4' which is performed in this embodiment.

As shown in FIG. 20, in this embodiment, auxiliary reset for supplying a reset signal to a cathode terminal of the PIN diode 4' via the reset scanning line RST is performed at a certain timing between main reset and another main reset, specifically, herein, in a latter half of a period in which electric charges (=data) are stored in the storage capacitor Cint, i.e., before a writing-out voltage is supplied to the storage capacitor Cint via the writing-out signal line RW to thereby increase the storage capacitor Cint. The auxiliary reset is started (time $t_5$) when the anode potential Nint is not higher than Vls$-$Vth_p. Thereafter, the auxiliary reset is completed (time $t_6$) after Nint is sufficiently discharged, and a timing of completing the auxiliary reset is desirably a moment at which the completion of the auxiliary reset does not interfere another operation, specifically, in FIG. 20, a timing before the writing-out voltage is supplied to the storage capacitor Cint via the writing-out signal line RW to thereby increase the storage capacitor Cint.

Because of the auxiliary reset, the anode potential Nint does not become higher than Vls$-$Vth_p and becomes a reset potential (low). Therefore, even if the anode potential is reduced again in a data writing-out period from the time $t_7$, the cathode potential does not become higher than Vls$-$Vth_p, and next main reset is performed. That is, according to the driving method of this embodiment, it is possible to prevent the PIN diode 4' from entering the mode B. This can solve the above problem, and residual electric charges do not offset a photocurrent (signal) caused by incident light, and it is possible to output a desirable amount of current (the line shape indicated by the broken line of the graph) which should be originally outputted.

Modification Example 1

The above embodiment has discussed a form where the auxiliary reset is performed in the latter half of the period in which the electric charges (=data) are retained in the storage capacitor Cint, i.e., before the writing-out voltage is supplied to the storage capacitor Cint via the writing-out signal line RW to thereby increase the storage capacitor Cint. However, the present invention is not limited thereto.

For example, as shown in a timing chart of Modification Example 1 in FIG. 21, the auxiliary reset may be performed in a period after the writing-out period (period between the time $t_5$ and the time $t_6$) but immediately before a next main reset, more specifically, immediately before the TFT6 is turned on (time t1). Therefore, even if the amount of incident light is large and the anode potential Nint is higher than Vls$-$Vth_p in the storage capacitor Cint in the period in which the electric charges (=data) are retained, the anode potential Nint can be prevented from being higher than Vls$-$Vth_p before a next main reset.

In this case, the electric charges, which were stored in the photodiode until $t_6$ and remained even when the auxiliary reset was performed, are removed during a period between $t_7$, which is a time after the auxiliary reset is completed, and $t_2$, and anode potentials immediately before the next main reset are not increased so much that the cathode potentials store electric charges. As a result, it is possible to prevent transition from the mode B to the mode A in the next main reset, i.e., generation of residual electric charges in the next main reset.

Modification Example 2

The above embodiment and Modification Example 1 are both forms in which auxiliary reset is implemented once between main reset and next main reset. However, the present invention is not limited thereto, and auxiliary reset may be performed a plurality of times between main reset and next main reset.

FIG. 22 shows a timing chart of Modification Example 2, the auxiliary reset is performed twice between main reset and next main reset.

Specifically, as shown in FIG. 22, first auxiliary reset (between the time $t_5$ and the time $t_6$) is performed in the latter half (between the time $t_5$ and the time $t_6$) of the period (between the time $t_4$ and the time $t_7$) in which electric charges (=data) are retained in the storage capacitor Cint, i.e., before the writing-out voltage is supplied to the storage capacitor Cint via the writing-out signal line RW to thereby increase the storage capacitor Cint, and then second auxiliary reset (between a time $t_8$ and a time $t_9$) is performed in a period not before a writing-out period (between the time $t_7$ and the time $t_8$) but immediately before a next main reset, more specifically, immediately before the TFT6 is turned on (time $t_1$).

According to the operating method, it is possible to prevent the PIN diode 4 from being driven in the mode B, and also to prevent residual electric charges from being generated in next main reset.

5. Effect of this Embodiment

As described above, according to the display device (optical sensor circuit) of this embodiment, between an anode terminal and a cathode terminal of a PIN diode, a potential of the anode terminal whose potential is changed in proportion to the amount of incident light can be set within a predetermined range within which storage of electrons is not induced in an intrinsic region of the PIN diode immediately before main reset in particular, specifically, the potential can be set to be smaller than a value represented by Vls−Vth_p immediately before main reset in particular. This makes it possible to prevent electric charges from being inconveniently stored in the intrinsic region of the photodiode, and residual electric charges are not generated in main reset performed immediately before next sensing. Therefore, it is possible to prevent residual holes from offsetting a photocurrent which is original data at the time of sensing, and, as described above, it is possible to maintain a relationship between the sensor output and the amount of incident light in a straight-line shape.

Third Embodiment

The following description will discuss another embodiment of a method of operating a display device according to the present invention. Note that, for the sake of easy explanation, members having the like functions as the figures described in Embodiment 1 are denoted by the like reference signs and the detailed description thereof is omitted.

A difference between the above Embodiment 1 and this embodiment is a method of processing an output which has been received from an optical sensor circuit.

Specifically, this embodiment is identical with Embodiment 1 in that three picture elements PIX of red (R), green (G), and blue (B) configure a single display circuit 12 and a single optical sensor circuit 11 is provided for each display circuit 12. This embodiment is different from Embodiment 1 in that, in this embodiment, a circuit for performing sensing while backlight of a liquid crystal display device is in an on state and a circuit for performing sensing while the backlight is in an off state are separated and each circuit is provided for each optical sensor circuit. This embodiment will be described with reference to FIG. 23 to FIG. 26.

FIG. 23 is a schematic view illustrating optical sensing of this embodiment. Generally, in a case of irradiating a target object with the backlight and sensing reflection from the target object provided on a top surface of an optical sensor circuit, signal light caused by lightning of the backlight and ambient light coexist in a sensed signal. In view of the circumstances, as illustrated in FIG. 23, in this embodiment, there are performed (i) first sensing for sensing reflection from the target object placed on a top surface of the optical sensor circuit in a state in which signal light caused by lightning of the backlight (BL ON of FIG. 23) and ambient light coexist and (ii) second sensing for sensing reflection from the target object placed on the top surface of the optical sensor circuit in a state in which the backlight is in an off state (BL OFF of FIG. 23), i.e., in a state in which merely ambient light exists, and a difference between a result of the first sensing and a result of the second sensing is calculated. In this way, it is possible to achieve accurate sensing without influence of ambient light.

The description will discuss such a display section compatible with such a backlight difference method with reference to FIG. 24. FIG. 24 schematically illustrates a part of a display section of this embodiment and is a circuit diagram of an optical sensor circuit mounted on the display section. As illustrated in FIG. 24, a pixel on which an optical sensor circuit for performing sensing while the backlight is in an on state and a pixel on which an optical sensor circuit for performing sensing when the backlight is in an off state, which pixels are arranged in a row direction, are alternately arranged in a column direction. In the row direction, pixels each on which an optical sensor circuit for performing sensing while the backlight is in an on state (or a pixel on which an optical sensor circuit for performing sensing while the backlight is in an off state) are arranged. As illustrated in FIG. 24, the optical sensor circuit of the above Embodiment 1 is mounted on each pixel. Note that, instead of the optical sensor circuit of the above Embodiment 1, the optical sensor circuit of the above Embodiment 2 may be mounted on each pixel.

FIG. 25 is a timing chart showing an operation of a liquid crystal display device of this embodiment. In the timing chart of FIG. 25, in order to distinguish an operation of the optical sensor circuit for performing sensing while the backlight is an on state from an operation of the optical sensor circuit for performing sensing while the backlight is in an off state, a reset scanning line RST 2, a signal line CLK 2, and an output OUT 2 are specified in the optical sensor circuit for performing sensing while the backlight is in an on state, and a reset scanning line RST 1, a signal line CLK 1, and an output OUT 1 are specified in the optical sensor circuit for performing sensing while the backlight is in an off state. Those are also shown in the circuit diagram of FIG. 24. Note that, as to writing-out signals, RW1, . . . , and Rn−1 of FIG. 25 correspond to RW1 of FIG. 24, and RW2, . . . , and RWn of FIG. 25 correspond to RW2 of FIG. 24 (n is an integral multiple of 2 starting from 2). As shown in FIG. 25, a backlight-turning-off optical sensor circuit and a backlight-turning-on optical sensor circuit are successively driven in a one display frame, and incident light data is retained temporarily. Thereafter, stored data are consecutively written out by rows. Note that the order of driving the backlight-turning-off optical sensor circuit and the backlight-turning-on optical sensor circuit may be any order. Further, the data may be written out by one row or by rows. Note, however, that, in a case where the data is written out in the unit of the plurality of rows, it is necessary to secure output wiring for data that is simultaneously written out. Furthermore, both sensing and writing-out are not limited to merely once in one display frame. By driving the optical sensor circuit with use of this timing chart, it is possible to implement the optical sensing by the backlight difference method.

Note that, as illustrated in FIG. 26, this embodiment has discussed a form ((1) of FIG. 26) in which the backlight-turning-off optical sensor circuits (or the backlight-turning-on optical sensor circuits) are arranged in the row direction of the display section 1' of the liquid crystal display device 50, however, there can be employed a form ((2) of FIG. 26) in which the backlight-turning-off optical sensor circuits (or the backlight-turning-on optical sensor circuits) are arranged in the column direction. Alternatively, there may be employed a form ((3) of FIG. 26) in which the backlight-turning-off optical sensor circuits and the backlight-turning-on optical sensor circuits are arranged to form a houndstooth check. Further, as another form, there may be employed a form ((4) of FIG. 26) in which different numbers of the backlight-turning-off optical sensor circuits and the backlight-turning-on optical sensor circuits are arranged.

The present invention is not limited to the description of the embodiments above, and can be modified in numerous ways by a skilled person as long as such modification falls within the scope of the claims. An embodiment derived from a proper combination of technical means disclosed in different embodiments is also encompassed in the technical scope of the present invention.

<Summary>

A method of operating an optical sensor circuit in accordance with the present invention, the optical sensor circuit comprising a PIN diode, a thin film transistor which is close to the PIN diode so as to be connected to the PIN diode and retains, as data, electric signals outputted from the PIN diode, and a light-blocking layer which is formed to be close at least to the PIN diode so as to block light incident in a certain direction on the PIN diode, the method includes the steps of: performing sensing of incident light with use of the PIN diode at regular intervals and performing main reset prior to each sensing; and performing auxiliary reset during a period between certain main reset and next main reset so that a potential of one of an anode terminal and a cathode terminal of the PIN diode immediately before the next main reset, the potential of which is changed in proportion to an amount of incident light, is reduced within a predetermined range within which storage of carriers is not induced in an intrinsic region of the PIN diode.

With this configuration, by performing auxiliary reset, it is possible that, between the anode terminal and the cathode terminal of the PIN diode, the potential of the terminal whose potential is changed in proportion to the amount of incident light is reduced within the predetermined range within which the storage of carriers is not induced in the intrinsic region of the PIN diode. Therefore, the carriers do not inconveniently stored in the intrinsic region. Accordingly, it is possible to maintain a relationship between a sensor output and the amount of incident light in a straight-line shape without changing, at the time of sensing, a photocurrent which is original data.

Here, the main reset means an operation of initializing nodes (Nint and NHint) prior to the sensing, in which operation electric charges, which are data signals, generated by photodiodes are stored, i.e., charging or discharging the electric charges prior to sensing so that the electric charges have initial potentials for the sensing. A potential after the reset is determined as a reference, and displacement of the Nint and the NHint caused by the following sensing is recognized as a data signal. That is, the main reset means reset which is performed in a circuit of (a) of FIG. 7 while a retaining transistor is in a on state.

Meanwhile, the auxiliary reset is an operation of retaining a potential of the Nint so that the potential has not less than or not more than a predetermined potential, and is an operation which does not influence original data signals (influence of residual storage electric charges, which is a problem that the present invention is to solve, is not caused by original data signals). That is, the auxiliary reset is reset which is performed in the circuit of (a) of FIG. 7 while the retaining transistor is in an off state.

In one form of the method of operating of an optical sensor circuit in accordance with the present invention, in addition to the above configuration, it is preferable that the auxiliary reset be performed a plurality of times between the certain main reset and the next main reset.

With the above configuration, it is possible to effectively prevent electric charges from being inconveniently stored in the intrinsic region.

In one form of the method of operating of an optical sensor circuit in accordance with the present invention, in addition to the above configuration, it is preferable that: between the anode terminal and the cathode terminal of the PIN diode, the terminal whose potential is changed in proportion to the amount of incident light be the cathode terminal; and the auxiliary reset be performed so that the potential of the cathode terminal immediately before the next main reset is larger than a value represented by the following formula (1)

$$Vls - Vth\_n \quad (1)$$

(Vls in the formula denotes a fixing voltage of the light-blocking layer and Vth_n in the formula denotes a voltage threshold by which the intrinsic region is inverted into an n-type one).

With the above configuration, in a case where the potential of the cathode terminal immediately before the main reset is larger than the value represented by Vls−Vth_n, electric charges (electrons) are not inconveniently stored in the intrinsic region, i.e., residual electric charges are not generated in the main reset performed immediately before the sensing.

In one form of the method of operating of an optical sensor circuit in accordance with the present invention, in addition to the above configuration, it is preferable that: between the anode terminal and the cathode terminal of the PIN diode, the terminal whose potential is changed in proportion to the amount of incident light be the anode terminal; and the auxiliary reset be performed so that the potential of the anode terminal immediately before the next main reset is smaller than a value represented by the following formula (2)

$$Vls - Vth\_p \quad (2)$$

(Vls in the formula denotes a fixing voltage of the light-blocking layer and Vth_p in the formula denotes a voltage threshold by which the intrinsic region is inverted into a p-type one).

With the above configuration, in a case where a potential of the anode terminal immediately before the main reset is smaller than the value represented by Vls−Vth_p, electric charges (holes) are not inconveniently stored in the intrinsic region, i.e., residual electric charges are not generated in the main reset performed immediately before the sensing.

Further, in order to achieve the above object, a method of operating a display device of the present invention, the display device comprising optical sensor circuit in each pixel, the optical sensor circuit including a PIN diode, a thin film transistor which is close to the PIN diode so as to be connected to the PIN diode and retains, as data, electric signals outputted from the PIN diode, and a light-blocking layer which is formed to be close at least to the PIN diode so as to block light incident in a certain direction on the PIN diode, the method includes the step of operating the optical sensor circuit by the above method.

With this configuration, by performing auxiliary reset, it is possible that, between the anode terminal and the cathode terminal of the PIN diode, the potential of the terminal whose potential is changed in proportion to the amount of incident light is reduced within the predetermined range within which the storage of carriers is not induced in the intrinsic region of the PIN diode. Therefore, the carriers do not inconveniently stored in the intrinsic region. Accordingly, it is possible to maintain a relationship between a sensor output and the amount of incident light in a straight-line shape without changing, at the time of sensing, a photocurrent which is original data.

In one form of the method of operating of a display device in accordance with the present invention, in addition to the above configuration, it is preferable that a certain optical sensor circuit perform sensing while the backlight is in an on state and another optical sensor circuit, which is different from the certain optical sensor circuit, perform sensing while the backlight is in an off state.

With the above configuration, by calculating the difference between the result of sensing of the optical sensor circuit for performing the sensing while the backlight is in an on state and the result of sensing of the optical sensor circuit for performing the sensing while the backlight is in an off state, it is possible to achieve accurate sensing without influence of ambient light.

INDUSTRIAL APPLICABILITY

The present invention can be applied to various devices including a circuit for performing optical sensing with use of a diode.

REFERENCE SIGNS LIST 1, 1' display section
4, 4' PIN diode
6 data retaining TFT
9 data writing-out TFT
10, 10' light-blocking layer
10a first light-blocking layer
10b second light-blocking layer
11, 11' optical sensor circuit
12 display circuit
21 pixel TFT
50 liquid crystal display device
CL liquid crystal capacitor
CLK signal line
Cint storage capacitor
Cs auxiliary capacitance
CsL storage capacitor wiring
GL gate line
NHint storage node
Nint anode potential, cathode potential
OUT optical sensor output line
PIX picture element
RST reset scanning line
RW writing-out signal line
SL source line
VDD power supply wiring
Va voltage applied to anode terminal
Vac bias
Vc voltage applied to cathode terminal
Vls light-blocking-layer fixing voltage
Vth inverted threshold
i intrinsic region

The invention claimed is:

1. A method of operating an optical sensor circuit, the optical sensor circuit comprising a PIN diode, a thin film transistor connected to the PIN diode and retains, as data, electric signals outputted from the PIN diode, and a light-blocking layer to block light incident in a direction on the PIN diode, the method comprising:

performing sensing of incident light by the PIN diode at regular intervals and performing a main reset prior to each sensing; and performing an auxiliary reset during a period between each main reset and a very next main reset, so that a potential of one of an anode terminal and a cathode terminal of the PIN diode immediately before the very next main reset, the potential of the one of the anode terminal and the cathode terminal of the PIN diode is changed in proportion to an amount of incident light, is reduced within a predetermined range within which storage of carriers is not induced in an intrinsic region of the PIN diode.

2. The method as set forth in claim 1, wherein the auxiliary reset is performed a plurality of times between the main reset and the very next main reset.

3. The method as set forth in claim 1, wherein:

among the anode terminal and the cathode terminal of the PIN diode, the terminal whose potential is changed in proportion to the amount of incident light is the cathode terminal; and the auxiliary reset is performed so that the potential of the cathode terminal immediately before the next main reset is larger than a value represented by the following formula (1)

$$Vls - Vth\_n \qquad (1)$$

(Vls in the formula denotes a fixing voltage of the light-blocking layer and $Vth\_n$ in the formula denotes a voltage threshold by which the intrinsic region is inverted into an n-type one).

4. The method as set forth in claim 1, wherein:

among the anode terminal and the cathode terminal of the PIN diode, the terminal with a potential that is changed in proportion to the amount of incident light is the anode terminal; and the auxiliary reset is performed so that the potential of the anode terminal immediately before the very next main reset is smaller than a value represented by the following formula (2)

$$Vls - Vth\_p \qquad (2)$$

(Vls in the formula denotes a fixing voltage of the light-blocking layer and $Vth\_p$ in the formula denotes a voltage threshold by which the intrinsic region is inverted into a p-type one).

5. A method of operating a display device comprising a plurality of optical sensor circuits each included in a respective one of a plurality of pixels, each of the plurality of optical sensor circuits includes a PIN diode, a thin film transistor connected to the PIN diode and retains, as data, electric signals outputted from the PIN diode, and a light-blocking layer to block light incident in a direction on the PIN diode, the method comprising operating each of the plurality of optical sensor circuits by a method as set forth in claim 1.

6. The method as set forth in claim 5, wherein the display device further comprises a backlight, and a first optical sensor circuit of the plurality of optical sensor circuits performs sensing while the backlight is in an on state and a second optical sensor circuit of the plurality of optical sensor circuits performs sensing while the backlight is in an off state.

* * * * *